US012242969B2

(12) United States Patent
Zhang et al.

(10) Patent No.: US 12,242,969 B2
(45) Date of Patent: Mar. 4, 2025

(54) GRAPH DIFFUSION FOR STRUCTURED PRUNING OF NEURAL NETWORKS

(71) Applicant: Nokia Technologies Oy, Espoo (FI)

(72) Inventors: Honglei Zhang, Tampere (FI); Francesco Cricri, Tampere (FI); Hamed Rezazadegan Tavakoli, Espoo (FI); Joachim Wabnig, Cambourne (GB); Iraj Saniee, New Providence, NJ (US); Miska Matias Hannuksela, Tampere (FI); Emre Aksu, Tampere (FI)

(73) Assignee: Nokia Technologies Oy, Espoo (FI)

( * ) Notice: Subject to any disclaimer, the term of this patent is extended or adjusted under 35 U.S.C. 154(b) by 926 days.

(21) Appl. No.: 17/354,398

(22) Filed: Jun. 22, 2021

(65) Prior Publication Data

US 2021/0397965 A1    Dec. 23, 2021

Related U.S. Application Data

(60) Provisional application No. 63/042,186, filed on Jun. 22, 2020.

(51) Int. Cl.
*G06N 3/08*    (2023.01)
*G06N 3/04*    (2023.01)
*G06N 3/082*   (2023.01)

(52) U.S. Cl.
CPC ............... *G06N 3/082* (2013.01); *G06N 3/04* (2013.01)

(58) Field of Classification Search
CPC ........ G06N 3/082; G06N 3/04; G06N 3/0495; H03M 7/3066; H03M 7/3068; H03M 7/3059
See application file for complete search history.

(56) References Cited

U.S. PATENT DOCUMENTS

2019/0005149 A1    1/2019  Wang et al.
2019/0362235 A1*  11/2019  Xu ........................... G06N 3/04

FOREIGN PATENT DOCUMENTS

WO    WO-2020/148482 A1    7/2020

OTHER PUBLICATIONS

Boukir et al., "Classification of Remote Sensing Data Using Margin-Based Ensemble Methods" (Year: 2013).*

(Continued)

*Primary Examiner* — Alan Chen
(74) *Attorney, Agent, or Firm* — Joseph C. Drish; McCarter & English, LLP

(57) ABSTRACT

An apparatus includes at least one processor; and at least one non-transitory memory including computer program code; wherein the at least one memory and the computer program code are configured to, with the at least one processor, cause the apparatus at least to: estimate an importance of parameters of a neural network based on a graph diffusion process over at least one layer of the neural network; determine the parameters of the neural network that are suitable for pruning or sparsification; remove neurons of the neural network to prune or sparsify the neural network; and provide at least one syntax element for signaling the pruned or sparsified neural network over a communication channel, wherein the at least one syntax element comprises at least one neural network representation syntax element.

26 Claims, 16 Drawing Sheets

(56) References Cited

OTHER PUBLICATIONS

Li et al., "Diffusion induced graph representation learning" (Year: 2019).*
Yeom et al., "Pruning by Explaining: A Novel Criterion for Deep Neural Network Pruning" (Year: 2019).*
Risi Imre Kondor and John Lafferty "Diffusion Kernels on Graphs and Other Discrete Input Spaces" School of Computer Science, Carnegie Mellon Univeristy, Pittsburgh, PA 15213 US. [retrieved Jun. 22, 2021].
Kyle Kloster and David F. Gleich "Heat Kernel Based Community Detection" Nov. 15, 2016.
Francois Fouss et al. "An Experimental Investigation of Graph Kernels on Collaborative Recommendation and Semisupervised Classification" Oct. 20, 2009.
Namhoon Lee et al. "SNIP: Single-Shot Network Pruning Based on Connection Sensitivity" University of Oxford. Feb. 23, 2019.
Seul-Ki Yeom et al. "Pruning by Explaining: A Novel Criterion for Deep Neural Network Pruning" Mar. 12, 2021.
Mahdi Biparva et al. "Compact Neural Representation Using Attentive Network Pruning" Department of Electrical Engineering and Computer Science York University. May 10, 2020.
Lucas Theis et al. "Faster Gaze Prediction with Dense Networks and Fisher Pruning" Jul. 9, 2018.
Pavlo Molchanov et al. "Pruning Convolutional Neural Networks for Resource Efficient Inference" Jun. 8, 2017.
Pavlo Molchanov et al. "Importance Estimation for Neural Network Pruning" Jun. 25, 2019.
Hao Li et al. "Pruning Filters for Efficient ConvNets" published as a conference paper at ICLR 2017. Mar. 10, 2017.
"Working Draft 4 of Compression of neural networks for multimedia content description and analysis", ISO/IEC JTC 1/SC 29/WG 11, N19225, May 15, 2020, 48 pages.
"Description of Core Experiments o Compression of neural networks for multimedia content description and analysis", ISO/IEC JTC 1/SC 29/WG 11,N19227, Apr. 30, 2020, 23 pages.
Wang, Tinghuai, et al. "Response to the Call for Proposal on Neural Network Compression: Simultaneously Learning Architectures and Features of Deep Neural Networks", ISO/IEC JTC1/SC29/WG11 MPEG2019/M47375, Mar. 2019, 5 pages.
Ayinde, Babajide O., et al., "Building Efficient ConvNets Using Redundant Feature Pruning", Department of Electrical and Computer engineering, University of Louisville, KY, USA, Workshop track—ICLR 2018, 9 pages.
Wang, Chu, et al., "A New Family of Near-metrics for Universal Similarity", Cornell University Library, Oct. 18, 2017, 26 pages.
Faggionato, Alessandra, "1D Mott variable-range hopping with external field", University La Sapienza, Rome Italy, Jun. 2018, 11 pages.
Tavakoli, Hamed R., et al., "[NNR] Method for combined pruning and sparsification", ISO/IEC JTC1/SC29/WG11 MPEG2020/m54376, Jun. 2020, 5 pages.
Tavakoli, Hamed R., et al., "[NNR] Results of method 9 (m54376): Combined pruning and sparsification", ISO/IEC JTC1/SC29/WG11 MPEG2020/m55003, Feb. 2020, 8 pages.
Tavakoli, Hamed R., et al., "Hybrid Pruning and Sparsification", IEEE 2021, pp. 3542-3546.

* cited by examiner

600

New_arch_struct{
    602 'MODEL_ID': Model_ID, indicates the known non-pruned architecture, e.g., VGG16
    604 "DATA_ORDER": enum(COL, ROW): is an enumeration indicating if the data was compressed in a row order or column order to be unpacked into the new element.
    606 "ELEMENT_1": DIM, "ELEMENT_1 is the unique name of the element and DIM is the new dimension of this element
    ...
    608
}

| Topology format | Type identifier | Type enumeration (may be 1 byte) |
|---|---|---|
| NNEF format | NNR_NNEF | 0x01 |
| ONNX format | NNR_ONNX | 0x02 |
| MPEG defined format | NNR_MPEG | 0x03 |
| Pruning topology information | NNR_PRUN | 0x04 |
| Reserved | | 0x05-0xFF |

| nnr_pruning_toplogy_container( ) { | Descriptor |
|---|---|
| 802 — NNR_REP_TYPE | u(2) |
| Reserved | u(6) |
| If (NNR_REP_TYPE && NNR_TPL_BMSK) { | |
| 804 — Order | u(1) |
| 806 — Sparse | u(1) |
| 807 — validity_bit_mask() | |
| } | |
| If (NNR_REP_TYPE && NNR_TPL_DICT) { | |
| 808 — count_ids | u(8) |
| For (j = 0; j < count_ids; j ++) { | |
| 810 — Element_id[j] | Str(v) |
| 812 — count_dims[j] | u(8) |
| for(j = 0; k < count_dims[j]; k++){ | |
| 814 — dim[k] | u(8) |
| } | |
| If (NNR_REP_TYPE && NNR_TPL_CSTR) { | |
| CONFIG_STR | Str(v) |
| 816 — | |
| 818 — byte_alignment() | |

FIG. 8

| The mechanism of signaling | Type identifier | Type enumeration (may be 3 bits) |
|---|---|---|
| Bitmask | NNR_TPL_BMSK | 000 |
| 902 Dictionary | NNR_TPL_DICT | 001 |
| 904 Configuration String | NNR_TPL_CSTR | 010 |

FIG. 9

GRAPH DIFFUSION FOR STRUCTURED PRUNING OF NEURAL NETWORKS

RELATED APPLICATION

This application claims priority to U.S. Provisional Application No. 63/042,186, filed Jun. 22, 2020, which is hereby incorporated by reference in its entirety.

TECHNICAL FIELD

The examples and non-limiting embodiments relate generally to multimedia transport and neural networks and, more particularly, to graph diffusion for structured pruning of neural networks.

BACKGROUND

It is known to provide standardized formats for exchange of neural networks.

SUMMARY

In accordance with an aspect, an apparatus includes at least one processor; and at least one non-transitory memory including computer program code; wherein the at least one memory and the computer program code are configured to, with the at least one processor, cause the apparatus at least to: estimate an importance of parameters of a neural network based on a graph diffusion process over at least one layer of the neural network; determine the parameters of the neural network that are suitable for pruning or sparsification; remove neurons of the neural network to prune or sparsify the neural network; and provide at least one syntax element for signaling the pruned or sparsified neural network over a communication channel, wherein the at least one syntax element comprises at least one neural network representation syntax element.

In accordance with an aspect, an example apparatus includes at least one processor; and at least one non-transitory memory including computer program code; wherein the at least one memory and the computer program code are configured to, with the at least one processor, cause the apparatus at least to: receive at least one syntax element over a communication channel related to a neural network, the at least one syntax element signaling that the neural network has been pruned or sparsified; wherein the at least one syntax element comprises at least one neural network representation syntax element; and decode the at least one syntax element to generate a decompressed configuration/ representation of the neural network.

In accordance with an aspect, an apparatus includes at least one processor; and at least one non-transitory memory including computer program code; wherein the at least one memory and the computer program code are configured to, with the at least one processor, cause the apparatus at least to: analyze a neural network to identify parameters of the neural network suitable for pruning or sparsification; remove neurons of the neural network with respect to a pruning ratio or a sparsification operation; and apply data dependent-based sparsification with regard to a sparsification ratio or task loss, to reduce at least one of the parameters of the neural network.

BRIEF DESCRIPTION OF THE DRAWINGS

The foregoing aspects and other features are explained in the following description, taken in connection with the accompanying drawings, wherein:

FIG. 6 is an example dictionary structure for signaling a pruned model.

FIG. 7 is an example topology format container that indicates a topology information update from a pruning algorithm.

FIG. 8 is an example pruning-based topology container that may be carried in the NNR topology payload.

FIG. 9 shows example values of an enumeration indicating how the topology update is provided.

DETAILED DESCRIPTION OF EXAMPLE EMBODIMENTS

Figure 1:
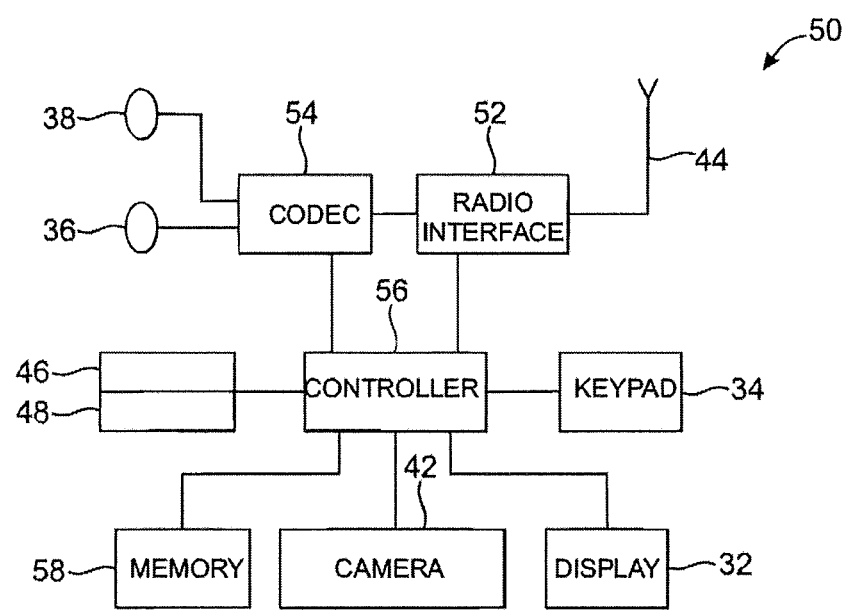
FIG. 1 shows schematically an electronic device employing embodiments of the examples described herein.
Figure 2:
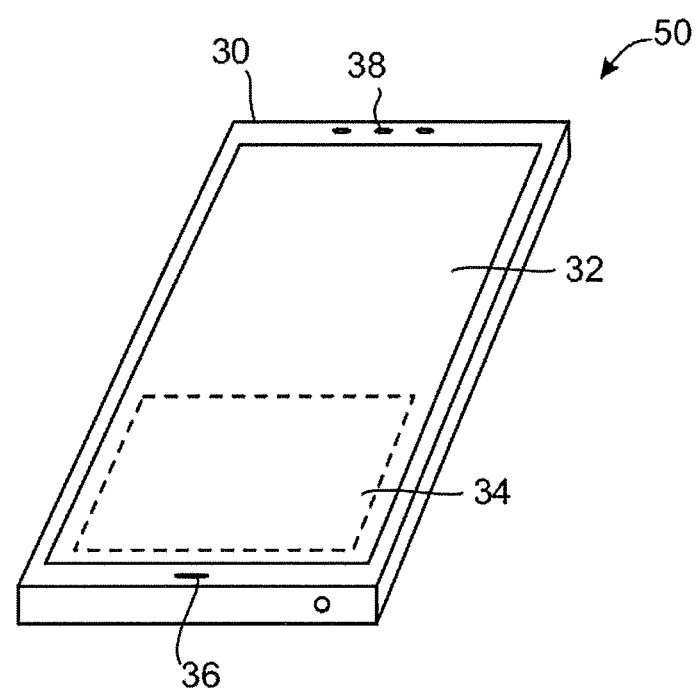
FIG. 2 shows schematically a user equipment suitable for employing embodiments of the examples described herein.

The following describes in detail a suitable apparatus and possible mechanisms for a video/image encoding process according to embodiments. In this regard reference is first made to FIG. 1 and FIG. 2, where FIG. 1 shows an example block diagram of an apparatus 50. The apparatus may be an Internet of Things (IoT) apparatus configured to perform various functions, such as for example, gathering information by one or more sensors, receiving or transmitting information, analyzing information gathered or received by the apparatus, or the like. The apparatus may comprise a video coding system, which may incorporate a codec. FIG. 2 shows a layout of an apparatus according to an example embodiment. The elements of FIG. 1 and FIG. 2 are explained next.

The electronic device 50 may for example be a mobile terminal or user equipment of a wireless communication system, a sensor device, a tag, or other lower power device. However, it would be appreciated that embodiments of the examples described herein may be implemented within any electronic device or apparatus which may process data by neural networks.

The apparatus 50 may comprise a housing 30 for incorporating and protecting the device. The apparatus 50 further may comprise a display 32 in the form of a liquid crystal display. In other embodiments of the examples described herein the display may be any suitable display technology suitable to display an image or video. The apparatus 50 may further comprise a keypad 34. In other embodiments of the examples described herein any suitable data or user interface mechanism may be employed. For example the user interface may be implemented as a virtual keyboard or data entry system as part of a touch-sensitive display.

The apparatus may comprise a microphone 36 or any suitable audio input which may be a digital or analog signal input. The apparatus 50 may further comprise an audio output device which in embodiments of the examples described herein may be any one of: an earpiece 38, speaker, or an analog audio or digital audio output connection. The apparatus 50 may also comprise a battery (or in other embodiments of the examples described herein the device may be powered by any suitable mobile energy device such as solar cell, fuel cell or clockwork generator). The apparatus may further comprise a camera capable of recording or capturing images and/or video. The apparatus 50 may further comprise an infrared port for short range line of sight communication to other devices. In other embodiments the apparatus 50 may further comprise any suitable short range communication solution such as for example a Bluetooth wireless connection or a USB/firewire wired connection.

The apparatus 50 may comprise a controller 56, processor or processor circuitry for controlling the apparatus 50. The controller 56 may be connected to memory 58 which in embodiments of the examples described herein may store both data in the form of image and audio data and/or may also store instructions for implementation on the controller 56. The controller 56 may further be connected to codec circuitry 54 suitable for carrying out coding and/or decoding of audio and/or video data or assisting in coding and/or decoding carried out by the controller.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system or a wireless local area network. The apparatus 50 may further comprise an antenna 44 connected to the radio interface circuitry 52 for transmitting radio frequency signals generated at the radio interface circuitry 52 to other apparatus(es) and/or for receiving radio frequency signals from other apparatus(es).

The apparatus 50 may comprise a camera capable of recording or detecting individual frames which are then passed to the codec 54 or the controller for processing. The apparatus may receive the video image data for processing from another device prior to transmission and/or storage. The apparatus 50 may also receive either wirelessly or by a wired connection the image for coding/decoding. The structural elements of apparatus 50 described above represent examples of means for performing a corresponding function.

Figure 3:
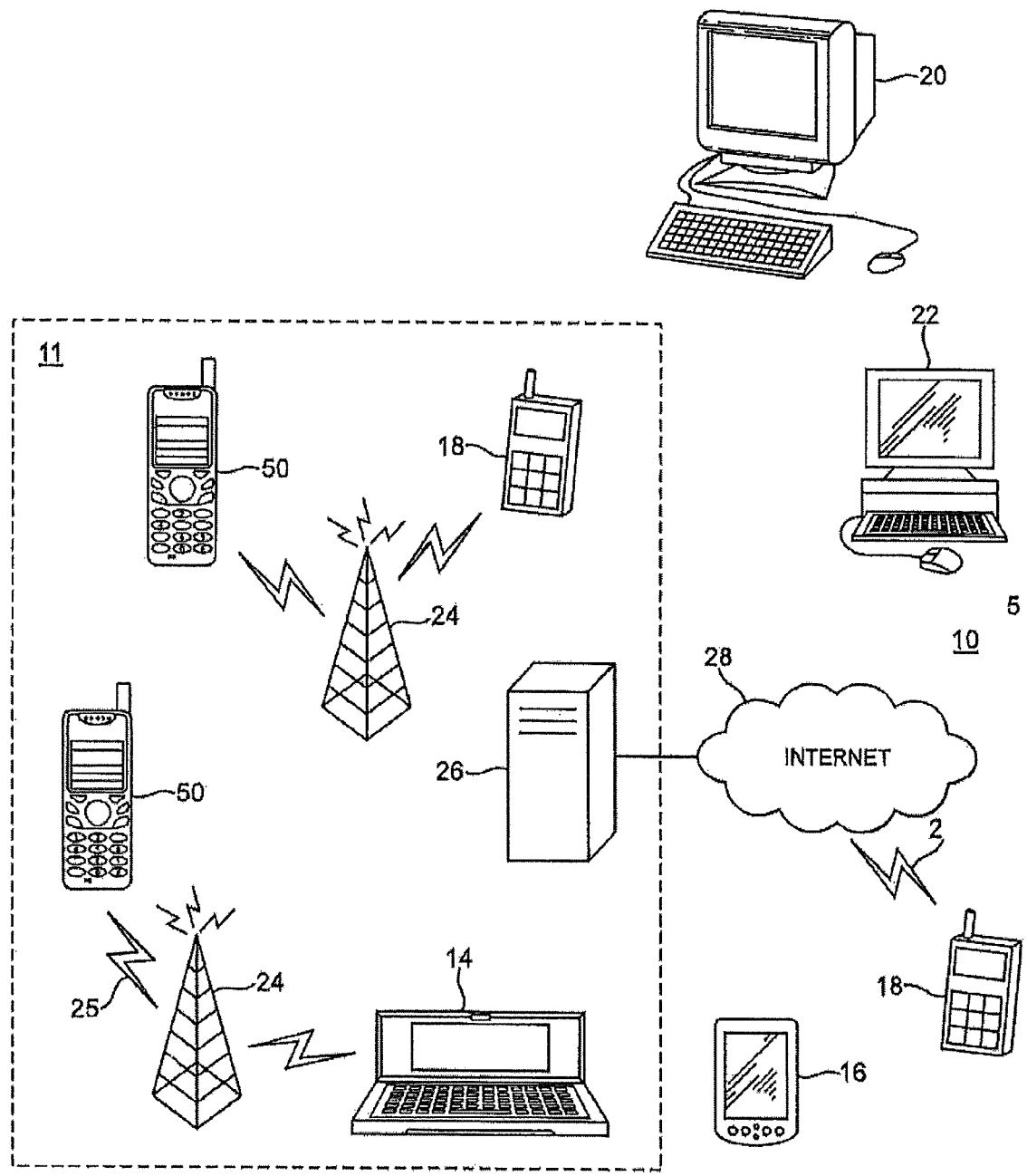
FIG. 3 further shows schematically electronic devices employing embodiments of the examples described herein connected using wireless and wired network connections.

With respect to FIG. 3, an example of a system within which embodiments of the examples described herein can be utilized is shown. The system 10 comprises multiple communication devices which can communicate through one or more networks. The system 10 may comprise any combination of wired or wireless networks including, but not limited to a wireless cellular telephone network (such as a GSM, UMTS, CDMA, LTE, 4G, 5G network etc.), a wireless local area network (WLAN) such as defined by any of the IEEE 802.x standards, a Bluetooth personal area network, an Ethernet local area network, a token ring local area network, a wide area network, and the Internet.

The system 10 may include both wired and wireless communication devices and/or apparatus 50 suitable for implementing embodiments of the examples described herein.

For example, the system shown in FIG. 3 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a notebook computer 22. The apparatus 50 may be stationary or mobile when carried by an individual who is moving. The apparatus 50 may also be located in a mode of transport including, but not limited to, a car, a truck, a taxi, a bus, a train, a boat, an airplane, a bicycle, a motorcycle or any similar suitable mode of transport.

The embodiments may also be implemented in a set-top box; i.e. a digital TV receiver, which may/may not have a display or wireless capabilities, in tablets or (laptop) personal computers (PC), which have hardware and/or software to process neural network data, in various operating systems, and in chipsets, processors, DSPs and/or embedded systems offering hardware/software based coding.

Some or further apparatus may send and receive calls and messages and communicate with service providers through a wireless connection 25 to a base station 24. The base station may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11, 3GPP Narrowband IoT and any similar wireless communication technology. A communications device involved in implementing various embodiments of the examples described herein may communicate using various media including, but not limited to, radio, infrared, laser, cable connections, and any suitable connection.

In telecommunications and data networks, a channel may refer either to a physical channel or to a logical channel. A physical channel may refer to a physical transmission medium such as a wire, whereas a logical channel may refer to a logical connection over a multiplexed medium, capable of conveying several logical channels. A channel may be used for conveying an information signal, for example a bitstream, from one or several senders (or transmitters) to one or several receivers.

The embodiments may also be implemented in so-called IoT devices. The Internet of Things (IoT) may be defined, for example, as an interconnection of uniquely identifiable embedded computing devices within the existing Internet infrastructure. The convergence of various technologies has and may enable many fields of embedded systems, such as wireless sensor networks, control systems, home/building automation, etc. to be included in the Internet of Things (IoT). In order to utilize the Internet IoT devices are provided with an IP address as a unique identifier. IoT devices may be provided with a radio transmitter, such as a WLAN or Bluetooth transmitter or a RFID tag. Alternatively, IoT devices may have access to an IP-based network via a wired network, such as an Ethernet-based network or a power-line connection (PLC).

An MPEG-2 transport stream (TS), specified in ISO/IEC 13818-1 or equivalently in ITU-T Recommendation H.222.0, is a format for carrying audio, video, and other media as well as program metadata or other metadata, in a multiplexed stream. A packet identifier (PID) is used to identify an elementary stream (a.k.a. packetized elementary stream) within the TS. Hence, a logical channel within an MPEG-2 TS may be considered to correspond to a specific PID value.

Available media file format standards include ISO base media file format (ISO/IEC 14496-12, which may be abbreviated ISOBMFF) and file format for NAL unit structured video (ISO/IEC 14496-15), which derives from the ISOBMFF.

A video codec consists of an encoder that transforms the input video into a compressed representation suited for storage/transmission and a decoder that can uncompress the compressed video representation back into a viewable form. A video encoder and/or a video decoder may also be separate from each other, i.e. need not form a codec. Typically the encoder discards some information in the original video sequence in order to represent the video in a more compact form (that is, at lower bitrate).

Typical hybrid video encoders, for example many encoder implementations of ITU-T H.263 and H.264, encode the video information in two phases. Firstly pixel values in a certain picture area (or "block") are predicted for example by motion compensation means (finding and indicating an area in one of the previously coded video frames that corresponds closely to the block being coded) or by spatial means (using the pixel values around the block to be coded in a specified manner). Secondly the prediction error, i.e. the difference between the predicted block of pixels and the original block of pixels, is coded. This is typically done by transforming the difference in pixel values using a specified transform (e.g. Discrete Cosine Transform (DCT) or a variant of it), quantizing the coefficients and entropy coding the quantized coefficients. By varying the fidelity of the quantization process, encoder can control the balance between the accuracy of the pixel representation (picture quality) and size of the resulting coded video representation (file size or transmission bitrate).

In temporal prediction, the sources of prediction are previously decoded pictures (a.k.a. reference pictures). In intra block copy (IBC; a.k.a. intra-block-copy prediction and current picture referencing), prediction is applied similarly to temporal prediction but the reference picture is the current picture and only previously decoded samples can be referred in the prediction process. Inter-layer or inter-view prediction may be applied similarly to temporal prediction, but the reference picture is a decoded picture from another scalable layer or from another view, respectively. In some cases, inter prediction may refer to temporal prediction only, while in other cases inter prediction may refer collectively to temporal prediction and any of intra block copy, inter-layer prediction, and inter-view prediction provided that they are performed with the same or similar process as temporal prediction. Inter prediction or temporal prediction may sometimes be referred to as motion compensation or motion-compensated prediction.

Inter prediction, which may also be referred to as temporal prediction, motion compensation, or motion-compensated prediction, reduces temporal redundancy. In inter prediction the sources of prediction are previously decoded pictures. Intra prediction utilizes the fact that adjacent pixels within the same picture are likely to be correlated. Intra prediction can be performed in the spatial or transform domain, i.e., either sample values or transform coefficients can be predicted. Intra prediction is typically exploited in intra coding, where no inter prediction is applied.

One outcome of the coding procedure is a set of coding parameters, such as motion vectors and quantized transform coefficients. Many parameters can be entropy-coded more efficiently if they are predicted first from spatially or temporally neighboring parameters. For example, a motion vector may be predicted from spatially adjacent motion vectors and only the difference relative to the motion vector predictor may be coded. Prediction of coding parameters and intra prediction may be collectively referred to as in-picture prediction.

Figure 4:
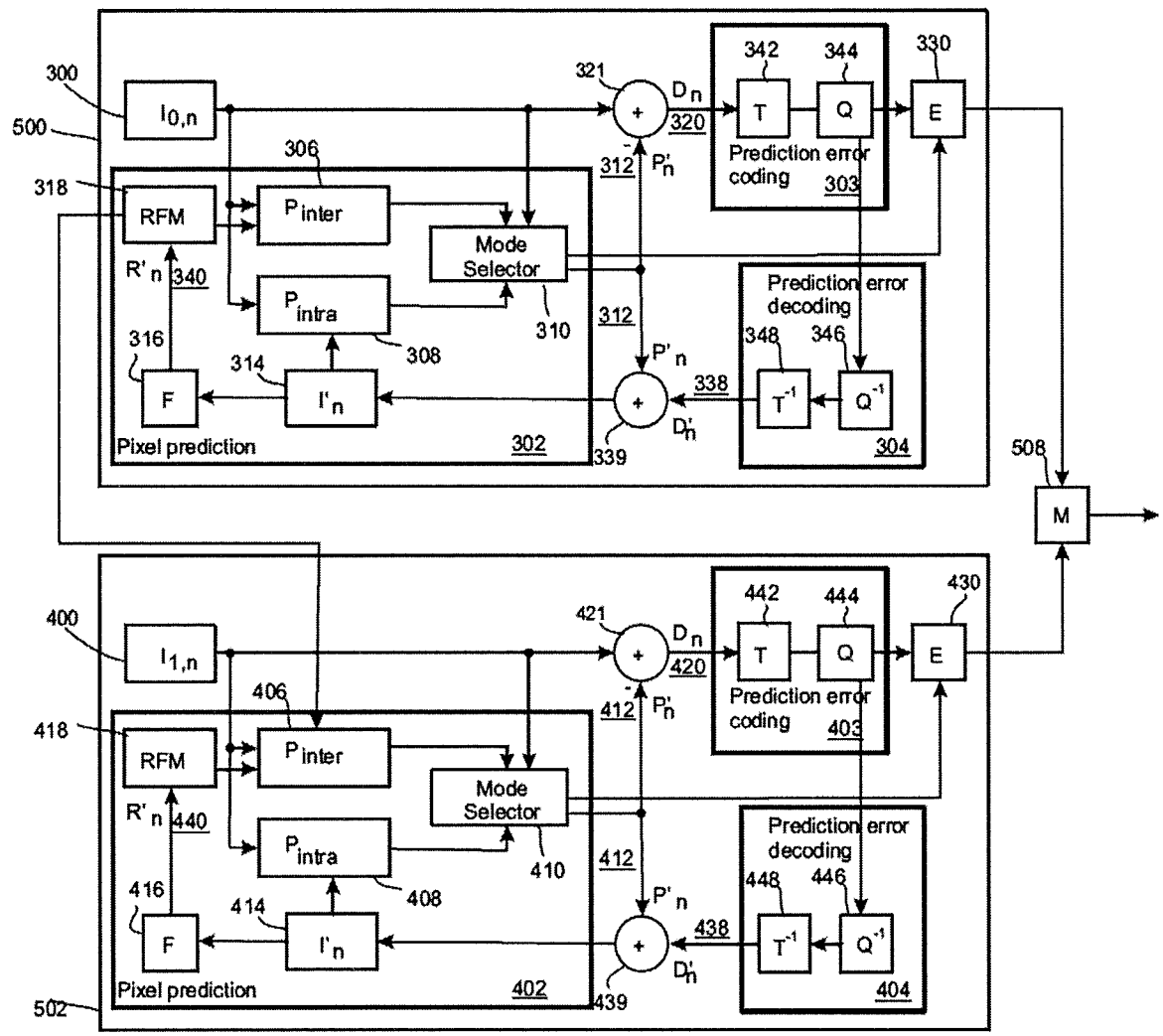
FIG. 4 shows schematically a block diagram of an encoder on a general level.

FIG. 4 shows a block diagram of a general structure of a video encoder. FIG. 4 presents an encoder for two layers, but it would be appreciated that presented encoder could be similarly extended to encode more than two layers. FIG. 4 illustrates a video encoder comprising a first encoder section 500 for a base layer and a second encoder section 502 for an enhancement layer. Each of the first encoder section 500 and the second encoder section 502 may comprise similar elements for encoding incoming pictures. The encoder sections 500, 502 may comprise a pixel predictor 302, 402, prediction error encoder 303, 403 and prediction error decoder 304, 404. FIG. 4 also shows an embodiment of the pixel predictor 302, 402 as comprising an inter-predictor 306, 406 ($P_{inter}$) an intra-predictor 308, 408 ($P_{intra}$), a mode selector 310, 410, a filter 316, 416 (F), and a reference frame memory 318, 418 (RFM). The pixel predictor 302 of the first encoder section 500 receives 300 base layer images ($I_{0,n}$) of a video stream to be encoded at both the inter-predictor 306 (which determines the difference between the image and a motion compensated reference frame 318) and the intra-predictor 308 (which determines a prediction for an image block based only on the already processed parts of the current frame or picture). The output of both the inter-predictor and the intra-predictor are passed to the mode selector 310. The intra-predictor 308 may have more than one intra-prediction modes. Hence, each mode may perform the intra-prediction and provide the predicted signal to the mode selector 310. The mode selector 310 also receives a copy of the base layer picture 300. Correspondingly, the pixel predictor 402 of the second encoder section 502 receives 400 enhancement layer images ($I_{1,n}$) of a video stream to be encoded at both the inter-predictor 406 (which determines the difference between the image and a motion compensated reference frame 418) and the intra-predictor 408 (which determines a prediction for an image block based only on the already processed parts of the current frame or picture). The output of both the inter-predictor and the intra-predictor are passed to the mode selector 410. The intra-predictor 408 may have more than one intra-prediction modes. Hence, each mode may perform the intra-prediction and provide the predicted signal to the mode selector 410. The mode selector 410 also receives a copy of the enhancement layer picture 400.

Depending on which encoding mode is selected to encode the current block, the output of the inter-predictor 306, 406 or the output of one of the optional intra-predictor modes or the output of a surface encoder within the mode selector is passed to the output of the mode selector 310, 410. The output of the mode selector is passed to a first summing device 321, 421. The first summing device may subtract the output of the pixel predictor 302, 402 from the base layer picture 300/enhancement layer picture 400 to produce a first prediction error signal 320, 420 ($D_n$) which is input to the prediction error encoder 303, 403.

The pixel predictor 302, 402 further receives from a preliminary reconstructor 339, 439 the combination of the prediction representation of the image block 312, 412 ($P'_n$) and the output 338, 438 (D'n) of the prediction error decoder 304, 404. The preliminary reconstructed image 314, 414 ($I'_n$) may be passed to the intra-predictor 308, 408 and to the filter 316, 416. The filter 316, 416 receiving the preliminary representation may filter the preliminary representation and output a final reconstructed image 340, 440 ($R'_n$) which may be saved in a reference frame memory 318, 418. The reference frame memory 318 may be connected to the inter-predictor 306 to be used as the reference image against which a future base layer picture 300 is compared in inter-prediction operations. Subject to the base layer being selected and indicated to be the source for inter-layer sample prediction and/or inter-layer motion information prediction of the enhancement layer according to some embodiments, the reference frame memory 318 may also be connected to the inter-predictor 406 to be used as the reference image against which a future enhancement layer picture 400 is compared in inter-prediction operations. Moreover, the reference frame memory 418 may be connected to the inter-predictor 406 to be used as the reference image against which a future enhancement layer picture 400 is compared in inter-prediction operations.

Filtering parameters from the filter 316 of the first encoder section 500 may be provided to the second encoder section 502 subject to the base layer being selected and indicated to be the source for predicting the filtering parameters of the enhancement layer according to some embodiments.

The prediction error encoder 303, 403 comprises a transform unit 342, 442 (T) and a quantizer 344, 444 (Q). The transform unit 342, 442 transforms the first prediction error signal 320, 420 to a transform domain. The transform is, for example, the DCT transform. The quantizer 344, 444 quantizes the transform domain signal, e.g. the DCT coefficients, to form quantized coefficients.

The prediction error decoder 304, 404 receives the output from the prediction error encoder 303, 403 and performs the opposite processes of the prediction error encoder 303, 403 to produce a decoded prediction error signal 338, 438 which, when combined with the prediction representation of the image block 312, 412 at the second summing device 339, 439, produces the preliminary reconstructed image 314, 414. The prediction error decoder 304, 404 may be considered to comprise a dequantizer 346, 446 ($Q^{-1}$), which dequantizes the quantized coefficient values, e.g. DCT coefficients, to reconstruct the transform signal and an inverse transformation unit 348, 448 ($T^{-1}$), which performs the inverse transformation to the reconstructed transform signal wherein the output of the inverse transformation unit 348, 448 contains reconstructed block(s). The prediction error decoder may also comprise a block filter which may filter the reconstructed block(s) according to further decoded information and filter parameters.

The entropy encoder 330, 430 (E) receives the output of the prediction error encoder 303, 403 and may perform a suitable entropy encoding/variable length encoding on the signal to provide error detection and correction capability. The outputs of the entropy encoders 330, 430 may be inserted into a bitstream e.g. by a multiplexer 508 (M).

Compressing neural networks is an important step for obtaining efficient and compact neural networks. Thus, there exists a significant interest in compressing neural networks and there exist various approaches to address this problem:

Sparsification-based solutions: These techniques employ a loss term like L1 norm or L0 norm applied on the weights of the neural network to promote sparsity in network structure and enforce some weights to zero.

Decomposition-based solutions: Methods that employ matrix decomposition to neural network layers and result in compact and efficient representations.

Structured pruning: These techniques completely remove neurons from the architecture. One example of a neuron is a convolutional kernel in a convolutional layer of a neural network. While they may keep the number of layers intact, they often do a coarse neural network filter pruning. These techniques can reduce the number of computational flops achieving both efficiency and compactness.

Hybrid sparsification and decomposition: These methods often run sparsification-based solutions and run decomposition-based approaches on top, e.g., to linear layers or all layers.

Graph diffusion is a classical approach in machine learning that is extensively studied in graph learning [refer to Risi Imre Kondor and John Lafferty. Diffusion kernels on graphs and other discrete structures. In ICML, 2002] for various tasks such as clustering [refer to Kyle Kloster and David F Gleich, Heat kernel based community detection, In KDD, 2014], and semi-supervised classification [refer to Francois Fouss, Kevin Francoisse, Luh Yen, Alain Pirotte, and Marco Saerens, An experimental investigation of kernels on graphs for collaborative recommendation and semisupervised classification. Neural Networks, 31:53-72, 2012]. The examples described herein implement graph diffusion for neural network pruning.

Related to standardization activities, including MPEG NNR, MPEG is developing a new standard for compressing and transporting neural network representations. The standardization activities involve several core experiments associated to compression and decompression steps, including: sparsification, quantization, and entropy coding. The examples described herein complement sparsification.

In particular, the examples described herein relate to a technique for structured pruning of neural networks, and mechanisms for signaling structured pruned neural networks and decoding them at the decoder side within the concept of NNR, related to high-level syntax (HLS).

MPEG Compression of Neural Networks (NNR) Standardization

MPEG is currently pursuing standardization of representations for compressed neural networks in the standardization group called NNR (Neural Network Representations).

The current status is that a Call for Proposals has been issued and several methods were proposed in response to that call. These methods are currently being evaluated and compared in Core Experiments (CEs). A Working Draft (WD) of the NNR Standard specification has been prepared during the MPEG NNR meetings. An initial version of high-level syntax (HLS) was included into the WD, and is covered in the previous disclosures U.S. Provisional Application No. 62/957982 and U.S. Provisional Application No. 63/010345.

The current MPEG NNR working draft is "ISO/IEC JTC1/SC29/WG11/N19225, Coding of Moving Pictures and Audio, April 2020, Working Draft 4 of Compression of neural networks for multimedia content description and analysis." Section 6 explains the details of the currently agreed upon high level syntax for NNR.

Currently the MPEG NNR activity is recognized under ISO/IEC15938-17, Multimedia content description interface—Part 17: Compression of neural networks for multimedia content description and analysis. The standard has reached the FDIS stage.

The HLS included in the WD comprises a basic structure for the organization of the bitstream. According to this structure, the NNR bitstream 502 is split into elemental units termed NNR Units (including 504-1, 504-2, 504-3, and 504-4). The NNR Unit 504 represents a basic high-level syntax structure, and contains three syntax elements: NNR Unit Size 506, NNR Unit Header 508, NNR Unit Payload 510. A bitstream 502 is formed by concatenating several NNR Units 504. NNR Units 504 may contain different types of data. The type of data that is contained in the payload of an NNR Unit defines the NNR Unit's type. This type is specified in the NNR Unit Header 508. The following table specifies the NNR unit header types and their identifiers (NN stands for neural network).

TABLE 1

| nnr_unit_type | Identifier | NNR Unit Type | Description |
|---|---|---|---|
| 0 | NNR_STR | NNR start unit | Compressed neural network bitstream start indicator |
| 1 | NNR_MPS | NNR model parameter set data unit | Neural network global metadata and information |
| 2 | NNR_LPS | NNR layer parameter set data unit | Metadata related to a partial representation of a neural network |
| 3 | NNR_TPL | NNR topology data unit | Neural network topology information |
| 4 | NNR_QNT | NNR quantization data unit | Neural network quantization information |
| 5 | NNR_NDU | NNR compressed data unit | Compressed neural network data |
| 6 | NNR_AGG | NNR aggregate unit | NNR unit with payload containing multiple NNR units |
| 7 ... 127 | NNR_RSVD | Reserved | MPEG-reserved range |
| 128 ... 255 | NNR_UNSP | Unspecified | Unspecified range |

In summary, an NNR unit 504 is a data structure for carrying neural network data and related metadata which is compressed or represented using this specification. NNR units 504 carry compressed or uncompressed information about neural network metadata, topology information, complete or partial layer data, filters, kernels, biases, quantization weights, tensors or alike.

An NNR unit 504 consists of the following data elements: NNR unit size 506, NNR unit header 508, and NNR unit payload 510. The NNR unit size 506 data element signals the total byte size of the NNR Unit 504, including the NNR unit size 506. The NNR unit header 508 data element contains information about the NNR unit 504 type and related metadata. The NNR unit payload 510 data element contains compressed or uncompressed data related to the neural network.

The NNR bitstream 502 is composed of a sequence of NNR Units 504 (such as NNR Units 504-1, 504-2, and 504-3). The first NNR unit (such as 504-1) in an NNR bitstream (such as 502) is an NNR start unit (i.e. NNR unit of type NNRSTR).

Figure 5:
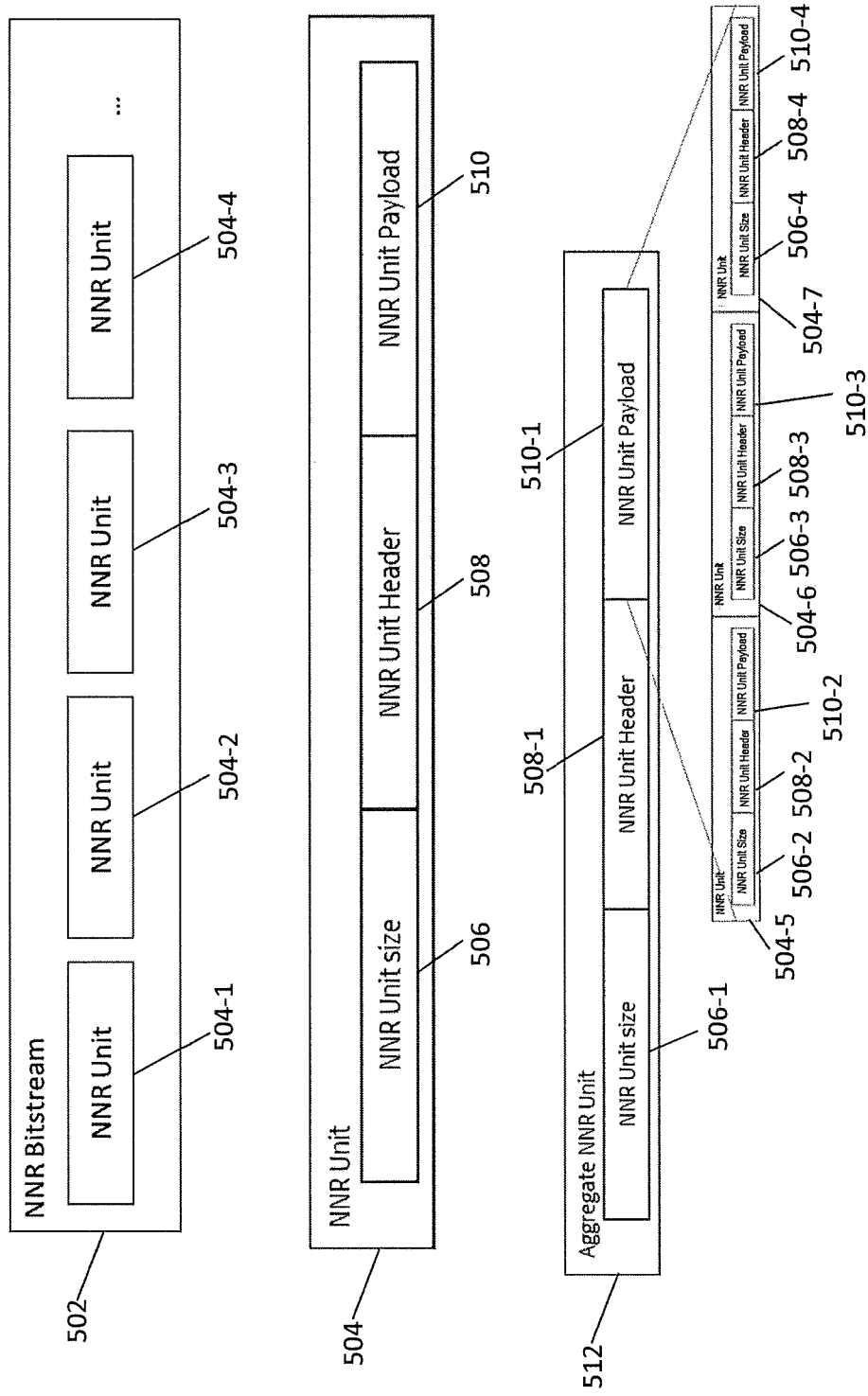
FIG. 5 depicts high-level general bitstream syntax elements.

As shown in FIG. 5, an aggregate NNR unit 512 is made up of several NNR units within its NNR Unit Payload 510-1, such as NNR units 504-5, 504-6, and 504-7. The aggregate NNR unit 512 also has a NNR unit size 506-1 and NNR unit header 508-1. As shown, each of NNR units 504-5, 504-6, and 504-7 has a NNR unit size (506-2, 506-3, 506-4), NNR unit header 508-2, 508-3, 508-4) and NNR unit payload (510-2, 510-3, 510-4).

Neural Network Exchange formats. Several efforts have been made in recent years to allow for unified or standardized formats for exchange of neural networks among different runtime platforms (Linux, Windows, Android, iOS, etc.), different deep learning frameworks (TensorFlow, Pytorch, etc.) and different languages (Python, C++, Java, etc.). Among these efforts, two are of notable interest: NNEF and ONNX. However, these exchange formats target general neural networks and are not optimized for compressed neural networks.

Structured pruning of neural networks requires understanding which neuron is suitable for pruning. Thus, the examples described herein provide a technique for determining which neuron to prune. The described approach relies on a graph diffusion technique for determining the importance of a neuron for eliminating it. The pruning may be performed on either convolutional filters or units of fully-connected layers, or both. The methods, techniques and syntax elements to be signaled for decoding a structured pruned neural network at a decoder side are also described/provided.

The method could also apply on a structure where specific blocks identify the importance of blocks. The structures may go beyond convolution filters or fully-connected (FC) layers.

The structured neural network pruning often relies on analyzing the contribution of neurons inside the neural network and removing the least contributing neurons from the neural architecture. This type of analysis could be done (a) between layers and (b) inside each layer. The examples described herein relate to category (b).

(a) Between layer analysis methods. The between layer methods often require some data to analyze the contribution of each neuron. Examples of such methods are

[SNIP: Single-shot Network Pruning based on Connection Sensitivity, Namhoon Lee, Thalaiyasingam Ajanthan, Philip H. S. Torr, ICLR 2019]

[Pruning by Explaining: A Novel Criterion for Deep Neural Network Pruning, Seul-Ki Yeoma, Philipp Seegerera, Sebastian Lapuschkinb, Simon Wiedemannb, Klaus-Robert Müllera, Wojciech Samekb, Dec. 18, 2019]

[Compact Neural Representation Using Attentive Network Pruning, Mandi Biparva, John Tsotsos, York University, Toronto, Canada, May 10, 2020]

[Faster gaze prediction with dense networks and Fisher pruning, Lucas Theis, Iryna Korshunova, Alykhan Tejani, Ferenc Huszár]

[Pruning Convolutional Neural Networks for Resource Efficient Inference, Pavlo Molchanov, Stephen Tyree, Tero Karras, Timo Aila, Jan Kautz]

[Importance Estimation for Neural Network Pruning, Pavlo Molchanov, Arun Mallya, Stephen Tyree, Iuri Frosio, Jan Kautz, NVIDIA, Jun. 25, 2019]

In general, in one pass of data the neurons response is measured, and some criteria is used to determine the usefulness of neurons by considering the relation between the neurons of different layers, e.g., based on the amount of gradients as in Biparva et al. above. The neurons that have the weakest links between two layers are often removed.

These methods often require a significant amount of data in order to determine which neuron to remove and also require a post-pruning fine-tuning step to recover the lost performance.

(b) Inside layer analysis methods. These methods consider the contribution of each neuron independent of other layers. They calculate the importance of a neuron by considering the weights associated to that neuron. An example of such methods and most relevant to the method described herein is the following:

[ICLR2017, Pruning Filters for Efficient ConvNets, Pruning Filters for Efficient ConvNets, Hao Li, Asim Kadav, Igor Durdanovic, Hanan Samet, Hans Peter Graf, ICLR 2017]

For example, Li et al. employs a sum of the L1 norm of the weights to calculate the importance of a neuron. These methods do not require data for determining which neuron to remove, but they may require a post-pruning fine-tuning operation as in category (a) depending on the performance loss.

The examples described herein relate to category (b) methods, and provide a novel approach for determining the amount of neuron importance.

From an MPEG NNR high-level syntax (HLS) perspective, the examples described herein elaborate further on the inventors' previous disclosures, US Provisional Application No. 63/010345 and U.S. Provisional Application No. 62/957982 and related MPEG contributions which are incorporated into the MPEG NNR WD4 (namely ISO/IEC JTC1/SC29/WG11/N, Coding of Moving Pictures and Audio, April 2020, Working Draft 3 of Compression of neural networks for multimedia content description and analysis).

Accordingly, a method is described herein for determining the amount of importance of a neuron in each layer and using it for neural network pruning. The technique is based on (1) a graph diffusion technique (i.e. applying graph diffusion for neural network pruning), (2) the method does not require any data for determining the importance of neurons, (3) the method can also operate in data dependent fashion that uses training data.

The proposed method could apply to determine the amount of importance of/in a given structure inside a neural network, e.g., the importance of a group of neurons, e.g., 4×4 blocks of neighboring neurons.

A model obtained by structured pruning techniques can be signaled to a decoder in the context of the MPEG neural network representation (NNR) standard and the corresponding high-level syntax for such methods.

In general, the technique has the following steps for determining the importance of neurons in each layer and then pruning the layer accordingly: (1) reshape and form a feature vector by considering the shape of the layer (based on the number of inputs and outputs and eventually other parameters of the layer such as the convolutional kernel size), (2) apply graph diffusion to determine neuron importance, (3) remove less important neurons, and (4) fine-tune the network for lost performance if required.

In step (3), to achieve a specific compression rate, the required number of neurons may be removed at once or gradually, as discussed within the progressive embodiment.

Graph diffusion may be applied to determine the importance of neurons in convolution layers.

Graph Diffusion for Determining Importance of Neurons in Convolution Layers:

Each convolution layer consists of a weight tensor, aka filter, denoted $\mathcal{F} \in \mathbb{R}\ C_o \times K \times K \times C_i$, where $C_o$ is the number of output channels, K is the dimension of the convolution kernel, and $C_i$ is the number of input channels.

Under constant input the redundancy in a layer output could be modeled by the internal redundant information inside the filter. Thus, by considering an ergodic Markov process between the output channels, a graph diffusion is employed to find the redundancy. To this end, given a convolution filter, $\mathcal{F}$, a feature matrix $M \in \mathbb{R}\ C_o \times m$ is obtained, where $m = K \times K \times C_i$, via tensor reshape.

Following the ergodic Markov chain with each output channel as one state, the probability of reaching a particular state at the equilibrium is, $$\pi^T = \pi^T P \qquad (1)$$

where P is the stochastic transition matrix and $\pi$ is the equilibrium probability of P, corresponding to the left eigenvector $\lambda=1$. Under equilibrium, the diversity could be defined as $$S = \exp\left(-\frac{1}{\sigma \pi}\right) \qquad (2)$$

$\sigma$ is a smoothing factor, that is equal to the number of output channels. The entries of the transition matrix P are determined as $$p_{ij} = \frac{e^{-D(m_i, m_j)}}{\sum_{z=1}^{C_o} e^{-D(m_i, m_z)}}, \qquad (3)$$

where $m_i$ is the i-th row of M and $D(.,.)$ is any distance function of preference.

The higher value of S will indicate more dissimilarity, importance and salience for an output channel in comparison to the rest of output channels. To prune the filters, after computing the S, the less salient channels are removed. The removing process could be achieved by putting the weight value to zero or omitting the corresponding weights in a weight matrix. The graph diffusion could apply to other neural elements and neural networks.

Examples of the distance function include L1 norm, L2 norm, cosine distance, etc. The method can utilize both a data dependent and a data independent distance metric.

Solution to the graph diffusion process: One way to solve the diffusion process is to use singular value decomposition (SVD). This is expensive for large graphs. Thus, whenever SVD is infeasible, e.g., for large graphs, the described solution is based on iterative power methods such as [James R Norris, Markov chains, Number 2, Cambridge university press, 1998] which has demonstrated to be useful in handling large graphs [refer to Wang et al, A New Family of Near-metrics for Universal Similarity]. Solutions using approximate spectral graph theories such as [Daniel A. Spielman, Spectral Graph theory, Combinatorial Scientific Computing, Chapman and Hall/CRC Press] are also possible. Whenever the graph is bidirectional symmetrically weighted, the solution to the diffusion process is proportional to the sum of the edge weights incident on each graph node.

Preliminary results on audio classification use case of NNR: The described approach was tested on the audio classification task of the MPEG NNR benchmark and compared to the NCTM baseline (i.e., the baseline sparsification algorithm used in the MPEG NNR's reference software) and to the prior art "L1" from reference [ICLR2017, Pruning Filters for Efficient ConvNets, Pruning Filters for Efficient ConvNets, Hao Li, Asim Kadav, Igor Durdanovic, Hanan Samet, Hans Peter Graf, ICLR 2017] above. The results are summarized in Table 2 below.

TABLE 2

| Model [non-zero ratio]@(fine-tuning epoch) | Top1 (%) accuracy | Top5 (%) accuracy |
| --- | --- | --- |
| Original | 58.27 | 91.85 |
| Described herein 0.37@50 | 89.01 | 99.87 |
| Described herein 0.16@300 | 77.90 | 99.75 |
| L1 0.37@50 | 89.2 | 99.51 |
| L1 0.16@300 | 76.54 | 99.50 |
| Nokia2 0.4@200 (baseline) | 60.37 | |
| Nokia2 0.18@200 (baseline) | 57.16 | |

The described approach improves the NNR baseline and the prior art, especially in high compression ratio (0.16), which is difficult for many approaches to operate. Overall the described approach outperforms the existing L1 based metric for pruning constantly on Top5 accuracy (which is often used as a criterion for model evaluation in neural network compression) and improves or performs similarly on the TOP1 metric. The described approach significantly improves over existing NNR technologies in the current WD of the standard for this use case.

Pruning strategies: After the determination of the importance of the neurons in one layer or multiple layers, different pruning strategies could be applied.

In one embodiment, a certain percentage X of filters in each convolution layer is uniformly removed, where X may be determined based on the desired compression ratio or based on the desired performance of the compressed neural network.

In another embodiment, a non-uniform pruning approach is implemented in which each i-th layer are pruned with X_i percentage, i.e., different pruning percentages may be used for different layers.

In another embodiment, a progressive pruning and fine-tuning approach is implemented where pruning and fine-tuning are alternated until achieving a desired compression ratio. In this embodiment, at first X percent of neurons are pruned and some fine-tuning is done to recover the lost performance, then the percentage of pruned filters is increased and the prune-and-finetune step is repeated again. The procedure may be repeated until the desired compression is achieved.

In another embodiment, instead of completely removing the filters, their weights are set to zero and the zeroed filters are kept in the architecture.

Application to other type of layers: As previously described, the examples herein are applicable to convolution layers. However, the method can apply to other layer types as well such as fully connected, recurrent layers, etc. For example, for the fully connected layers, the weight matrix of each layer can be considered as a system of linear equations and the weight vector corresponding to the output can be used as a feature vector. In short, the described approach does not require reshaping the weight matrix. On the other hand, the described method just considers the row or column vectors of the weight matrix (depending on the implementation) as features and proceeds with the removal of less important neurons at the output of the layer.

Sparsification and structured pruning: For neural networks that do not have convolution layers, or the percentage of convolutional parameters versus parameters of fully-connected layers is small (e.g. VGG), or in order to utilize efficiency of sparse calculations, in another embodiment, a structured pruning method is combined with sparsification approaches, e.g., the Nokia method of PCT Application Number PCT/FI2020/050045 which is the NCTM baseline "Nokia2". That is, after the pruning or during the pruning the sparsification loss term is used as an additional term in the fine-tuning objective function, and eventually the weight values smaller than a threshold are set to zero. In another embodiment, an additional loss term may be used in the fine-tuning objective function, which encourages the neurons such as the convolutional kernels in a convolutional layer to be dissimilar from other convolutional kernels in the same convolutional layer. For example, a loss term encouraging orthogonalization of neurons may be used, i.e., a loss term which is minimized when the plurality of vectors corresponding to the weights vectors of a plurality of neurons are orthogonal with each other.

Data dependent importance calculation embodiment: This embodiment involves a data dependent version of the algorithm. In this embodiment, the graph diffusion applies to the activations of the neurons (i.e., the output of the neurons) given a data evaluation phase. That is for each minibatch (B) of data, the importance of neurons of a layer is calculated and denoted as $I_{B_n}$, where n indicates the nth minibatch. After the data-dependent step, the final importance of each layer is calculated using $F(I_{b_1}, \ldots, I_{b_n})$, where F(.) is a function that calculates the final importance. Such a function could be a cumulative operation such as a summation, an average, or a more advanced approach, e.g., another level of graph diffusion or other saliency measure. After calculating the final importance in a data dependent manner, the pruning and fine-tuning steps may be as aforementioned.

Embodiment on fine-grained importance calculation and pruning or sparsification of convolution layers using graph diffusion: In another embodiment, the described technique is used for fine-grained pruning/sparsification. That is, for convolution layers, a single neuron weight can be removed or set to zero, rather than a complete kernel or filter. In this embodiment, each neuron weight is considered in the formation of the adjacency matrix and pruning happens for a single neuron.

The fine-grained importance calculation can be done for each layer, group of layers, or all the neurons of the model. In this embodiment, the constraint for removing a single neuron is that the removal of a neuron shall not create a disconnection in the computational graph. In another embodiment, the same technique could apply on weight updates for incremental weight update compression.

Signaling and decoding a structured pruned neural network. For signaling and decoding a structured-pruned neural network such as one obtained from the described algorithm, the following approaches may be implemented: i) bit masking, ii) dictionary of elements and dimensions, and/or iii) configuration string. Given the configuration, the decoder restores a new neural network configuration or a sparse representation of an original neural network.

For bit masking, a bitmask is introduced to determine the pruned and non-pruned filters. In this method, various elements are signaled including a filter-validity-mask (or filter-validity-bitmask), a tensor dimension, an order, and a densified weight tensor. A filter-validity-mask is a bit mask that signals which filters are kept and which ones are removed. The mask may be set to zero for a filter that is removed. A filter could be completely removed or some elements of the filter would be set to zero. The latter could be used when sparsification loss is used. The tensor dimension refers to the dimensions of the original filter tensor. The order indicates if the original filter tensor is processed in row order or column order to obtain a dense weight vector. The ordering may be used for uncompressing the dense weight tensor. The densified weight tensor contains the nonzero elements of the filter tensor after being pruned.

Decoding for sparsified network: Upon receiving a filter-validity-bitmask, the decoder uncompresses the densified weight tensor into its original form factor using the bitmask and order to assign the elements of the densified weight tensor to their location. An original size tensor is created using the tensor dimension.

Decoding for compressed-pruned network: Upon receiving a filter-validity-bitmask the decoder uses the bitmask to drop the links in a neural network architecture and restore the weight values from the densified weight tensor into an original tensor copy and rearrange the values into the new pruned neural network.

A dictionary of elements and dimensions may be defined, including a dictionary of element id and their new dimension, data_order. The approach is suitable for signaling a pruned model. An example of a dictionary structure 600 is provided in FIG. 6.

As shown in FIG. 6, MODEL_ID 602 indicates the known non-pruned architecture, e.g., VGG16, DATA_ORDER 604 is an enumeration indicating if the data was compressed in a row order or column order to be unpacked into the new element, ELEMENT_1 606 is the unique name of the element, and DIM 608 is the new dimension of this element.

Decoder side action: Upon receiving the new mode dictionary, the decoder asserts the MODEL_ID 602 with its expected architecture. It then parses the dictionary 600 with the elements in the dictionary 600 and recreates the tensors with the new dimensions. It then unpacks the sent data into the tensors given the DATA_ORDER 604.

A configuration string may also be applied. A configuration string is another way of signaling a pruned model. It can be another representation for a dictionary of elements. In this mode, a string containing a string of elements (element ids) and dimensions is signaled instead of the dictionary. The string is a delimiter separated one that could be generated by BNF or its variants of context free grammar. An example of such configuration string could be "NET_ID ELEMENT_ID_1 16 ELEMENT_ID_2 32 . . . ". On the decoder side, the decoder parses the signaled string to reconstruct a model using the new configuration to load the weights into memory.

In another embodiment, MODEL)ID could be a URL or identifier which references a particular neural network topology. Such a topology may be stored in a NNR bitstream in NNR units of type NNR_TPL.

Extension to high-level syntax for supporting the described signaling mechanism. The following may be added to the high-level syntax (HLS) in order to support the signaling mechanism of the pruning methods to the decoder.

Extension to NNR model parameter set: Extensions to the model parameter set based on the examples described herein include a pruning flag (e.g., pruning flag) and a data ordering flag (e.g., data_ordering_flag). The pruning flag specifies whether pruning is used to the model, and the data ordering flag, if set to 1, indicates that the data is to be handled column wise, and if set to 0, indicates a row-major processing during processing of the model.

Extension to NNR topology. A new topology format container may be provided that indicates a topology information update from a pruning algorithm. The new topology format container 700 is shown in FIG. 7 and also below:

| Topology format | Type identifier | Type enumeration (may be 1 byte) |
| --- | --- | --- |
| NNEF format | NNR_NNEF | 0x01 |
| ONNX format | NNR_ONNX | 0x02 |
| MPEG defined format | NNR_MPEG | 0x03 |
| Pruning topology information | NNR_PRUN | 0x04 |
| Reserved | | 0x05-0xFF |

NNR_PRUN 702 indicates that the NNR topology unit payload contains a topology information update that follows the signaling mechanisms mentioned above.

NNR Pruning-based topology container. The pruning-based topology container may be carried in the NNR Topology payload and in some examples has the syntax shown in FIG. 8 and also below.

| | Descriptor |
| --- | --- |
| nnr_pruning_toplogy_container( ) { | |
|   NNR_REP_TYPE | u(2) |
|   Reserved | u(6) |
|   If (NNR_REP_TYPE && NNR_TPL_BMSK) { | |
|     Order | u(1) |
|     Sparse | u(1) |
|     validity_bit_mask( ) | |
|   } | |
| If (NNR_REP_TYPE && NNR_TPL_DICT) { | |
|   count_ids | u(8) |
|   For (j = 0; j < count_ids; j ++) { | |
|     Element_id[j] | Str(v) |
|     count_dims[j] | u(8) |
|     for(j = 0; k < count_dims[j]; k++){ | |
|       dim[k] | u(8) |
|     } | |
| If (NNR_REP_TYPE && NNR_TPL_CSTR) { | |
|   CONFIG_STR | Str(v) |
| } | |
| byte_alignment( ) | |

Thus, FIG. 8 shows an example pruning-based topology container 800. NNR_REP_TYPE 802 is an enumeration indicating how the topology update is provided, may have one of the values shown in FIG. 9 and also below:

| The mechanism of signaling | Type identifier | Type enumeration (may be 3 bits) |
|---|---|---|
| Bitmask | NNR_TPL_BMSK | 000 |
| Dictionary | NNR_TPL_DICT | 001 |
| Configuration String | NNR_TPL_CSTR | 010 |

Figure 10:
FIG. 10 is an example definition of a validity bit mask.

In the syntax (shown in FIG. 8 and above), Order 804 is bit indicating if the bitmask should be processed row-major or column-major. Sparse 806 is a bit indicating if the bitmask should be used to sparsify the network topology or prune it. If Sparse 806 is set to 1, the decoder uses the bitmask to zero indicated locations, otherwise the decoder prunes. count ids 808 is the number of element ids that are updated. Element_id 810 is a unique element id variable that is used to reference an element. count_dims 812 is a variable referencing the number of dimensions for an element. dim 814 is an array of dimensions that contain the new dimensions for the specified element. CONFIG_STR 816 is a string containing the new configuration of the topology.

validity_bit_mask( ) 807 may be defined as shown in FIG. 10, and below:

|  | Descriptor |
|---|---|
| validity_bit_mask( ) { |  |
|   count_bits | u(32) |
|   for(j = 0; j < count_bits; j++ ) { |  |
|     bit_mask[j] | u(1) |
|   } |  |
|   byte_alignment( ) |  |
| } |  | count_bits 1002 provides the number of bits present in the bit mask 1004 information. byte_alignment( ) 818 provides byte alignment to the validity_bit_mask( ) 807 data structure and it is as defined in the NNR WD.

In another embodiment, bitmask information (e.g., bit_mask 1004) could be further entropy coded. Any entropy coding method may be used in the embodiment. Examples of suitable entropy coding methods include DEFLATE, as specified in RFC 1951 by the Internet Engineering Task Force, and context-based binary arithmetic coding (CABAC). The entropy-coded bitmask may be included in the NNR bitstream. Similarly, in the respective embodiment for the decoding side, an entropy-coded bit_mask 1004 may be further decompressed after being read from the NNR bitstream.

Decoding process: Upon receiving the topology payload corresponding to the pruning topology update, the decoder checks the type of payload and loads the payload into memory for processing. In the case of utilizing a bitmask, the decoder uses it to parse the current model architecture and drop the unnecessary weights or sparsify the network. For NNR_TPL_DICT 902 and NNR_TPL_CSTR 904, the decoder uses the provided element IDs and their dimensions to reconfigure the tensors and if required the dependent tensors on those tensors is reconfigured, e.g., the number of inputs to a layer from the pruned outputs of the previous layer.

Figure 11:
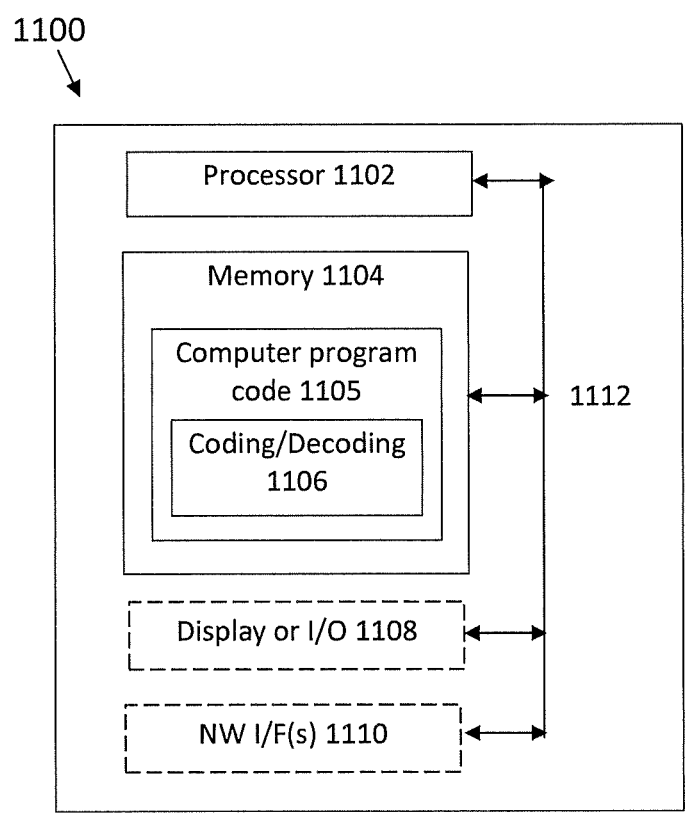
FIG. 11 is an example apparatus configured to implement graph diffusion for structured pruning of neural networks, based on the examples described herein.

FIG. 11 is an example apparatus 1100, which may be implemented in hardware, configured to implement graph diffusion for structured pruning of neural networks, based on the examples described herein. The apparatus 1100 comprises a processor 1102, at least one transitory or non-transitory memory 1104 including computer program code 1105, wherein the at least one memory 1104 and the computer program code 1105 are configured to, with the at least one processor 1102, cause the apparatus 1100 to implement encoding and/or decoding (collectively coding/decoding 1106), based on the examples described herein. The apparatus 1100 optionally includes a display or I/O 1108 that may be used to display content during encoding or decoding and/or receive input. The apparatus 1100 optionally includes one or more network (NW) interfaces (I/F(s)) 1110. The NW I/F(s) 1110 may be wired and/or wireless and communicate over the Internet/other network(s) via any communication technique. The NW I/F(s) 1110 may comprise one or more transmitters and one or more receivers. The N/W I/F(s) 1110 may comprise standard well-known components such as an amplifier, filter, frequency-converter, (de)modulator, and encoder/decoder circuitry(ies) and one or more antennas. In some examples, the processor 1102 is configured to implement coding/decoding 1106 without use of memory 1104.

The memory 1104 may be implemented using any suitable data storage technology, such as semiconductor based memory devices, flash memory, magnetic memory devices and systems, optical memory devices and systems, fixed memory and removable memory. The memory 1104 may comprise a database for storing data. Interface 1112 enables data communication between the various items of apparatus 1100, as shown in FIG. 11. Interface 1112 may be one or more buses, or interface 1112 may be one or more software interfaces configured to pass data within computer program code 1105. For example, the interface 1112 may be an object-oriented interface in software, or the interface 1112 may be one or more buses such as address, data, or control buses, and may include any interconnection mechanism, such as a series of lines on a motherboard or integrated circuit, fiber optics or other optical communication equipment, and the like. The apparatus 1100 need not comprise each of the features mentioned, or may comprise other features as well. The apparatus 1100 may be an embodiment of any of the apparatuses shown in FIGS. 1 through 4 including any combination of those. The apparatus 1100 may be an encoder or decoder.

Figure 12:
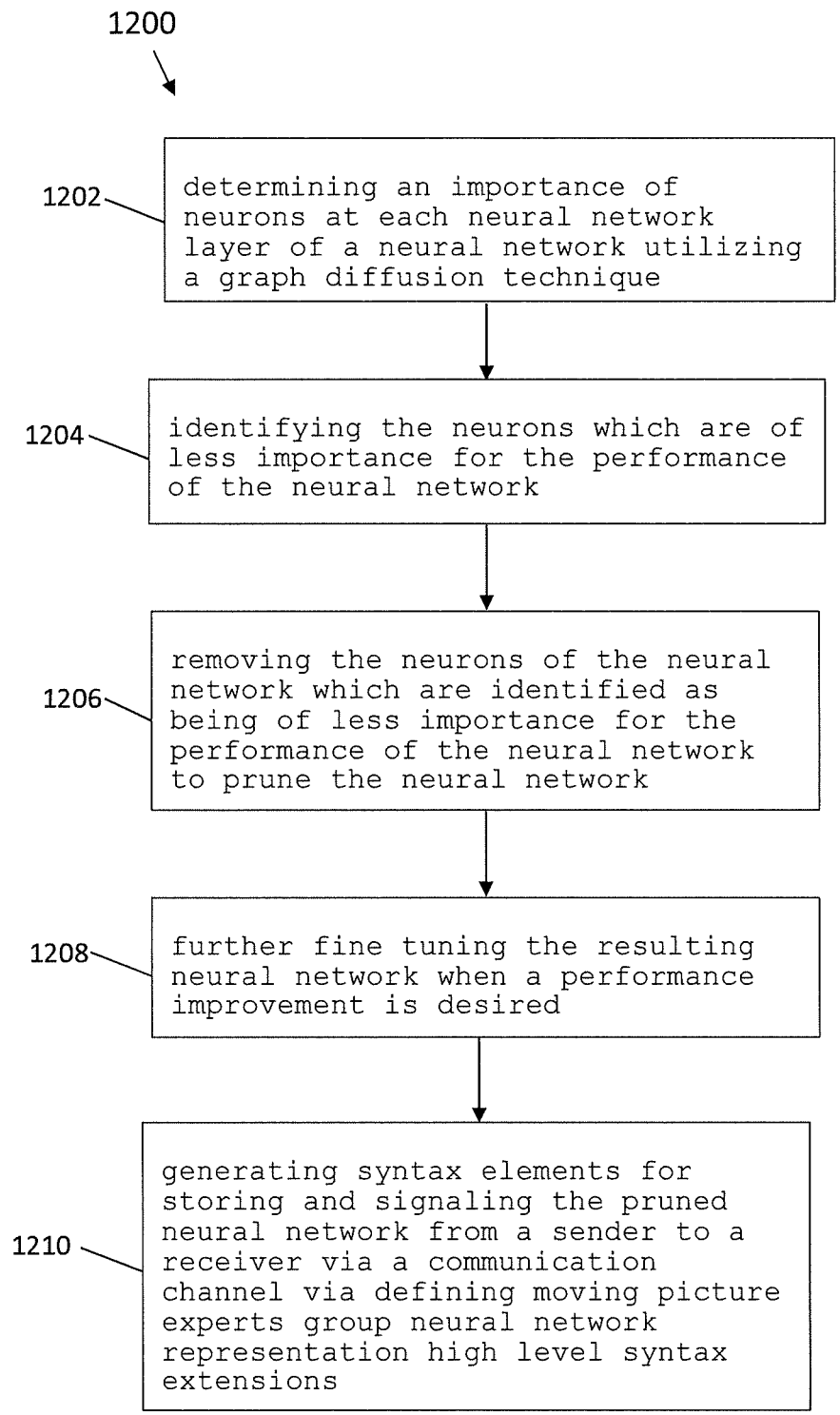
FIG. 12 is an example encoder side method to implement graph diffusion for structured pruning of neural networks, based on the examples described herein.

FIG. 12 is an example encoder side method to implement graph diffusion for structured pruning of neural networks, based on the examples described herein. At 1202, the method includes determining an importance of neurons at each neural network layer of a neural network utilizing a graph diffusion technique. At 1204, the method includes identifying the neurons which are of less importance for the performance of the neural network. At 1206, the method includes removing the neurons of the neural network which are identified as being of less importance for the performance of the neural network to prune the neural network. At 1208, the method includes further fine tuning the resulting neural network when a performance improvement is desired. At 1210, the method includes generating syntax elements for storing and signaling the pruned neural network from a sender to a receiver via a communication channel via defining moving picture experts group neural network representation high level syntax extensions.

Figure 13:
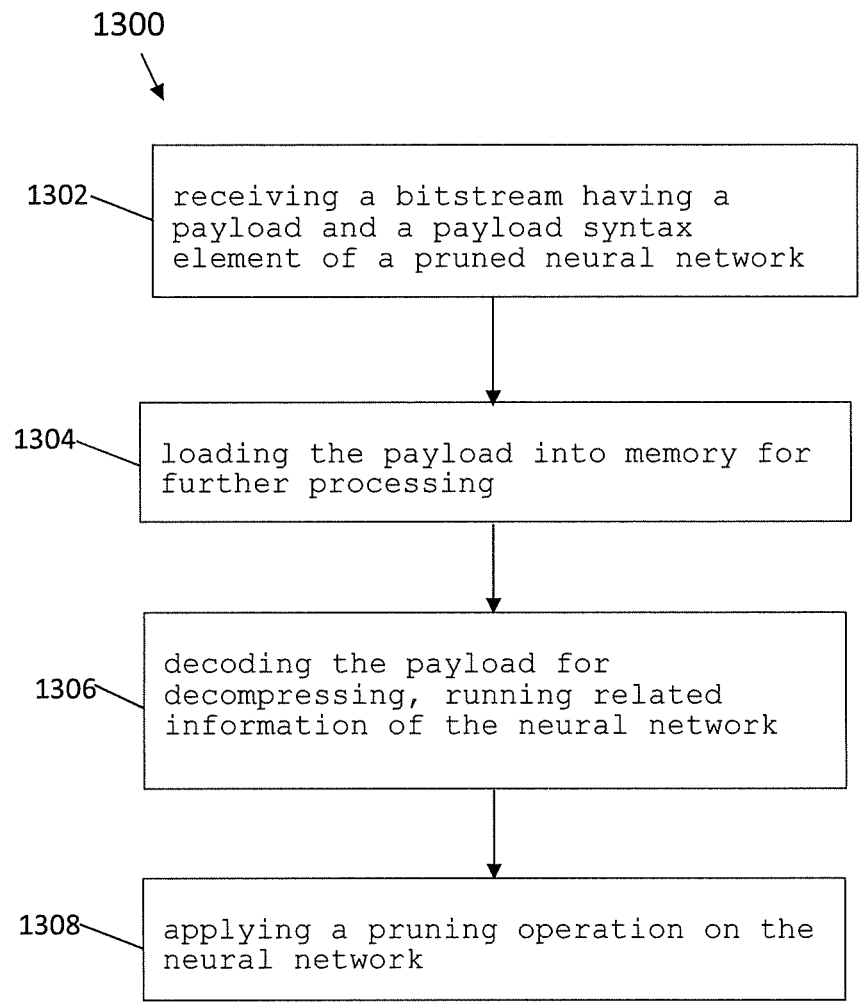
FIG. 13 is an example decoder side method to implement graph diffusion for structured pruning of neural networks, based on the examples described herein.

FIG. 13 is an example decoder side method to implement graph diffusion for structured pruning of neural networks, based on the examples described herein. At 1302, the method includes receiving a bitstream having a payload and a payload syntax element of a pruned neural network. At 1304, the method includes loading the payload into memory for further processing. At 1306, the method includes decoding the payload for decompressing, running related information of the neural network. At 1308, the method includes applying a pruning operation on the neural network.

Figure 14:
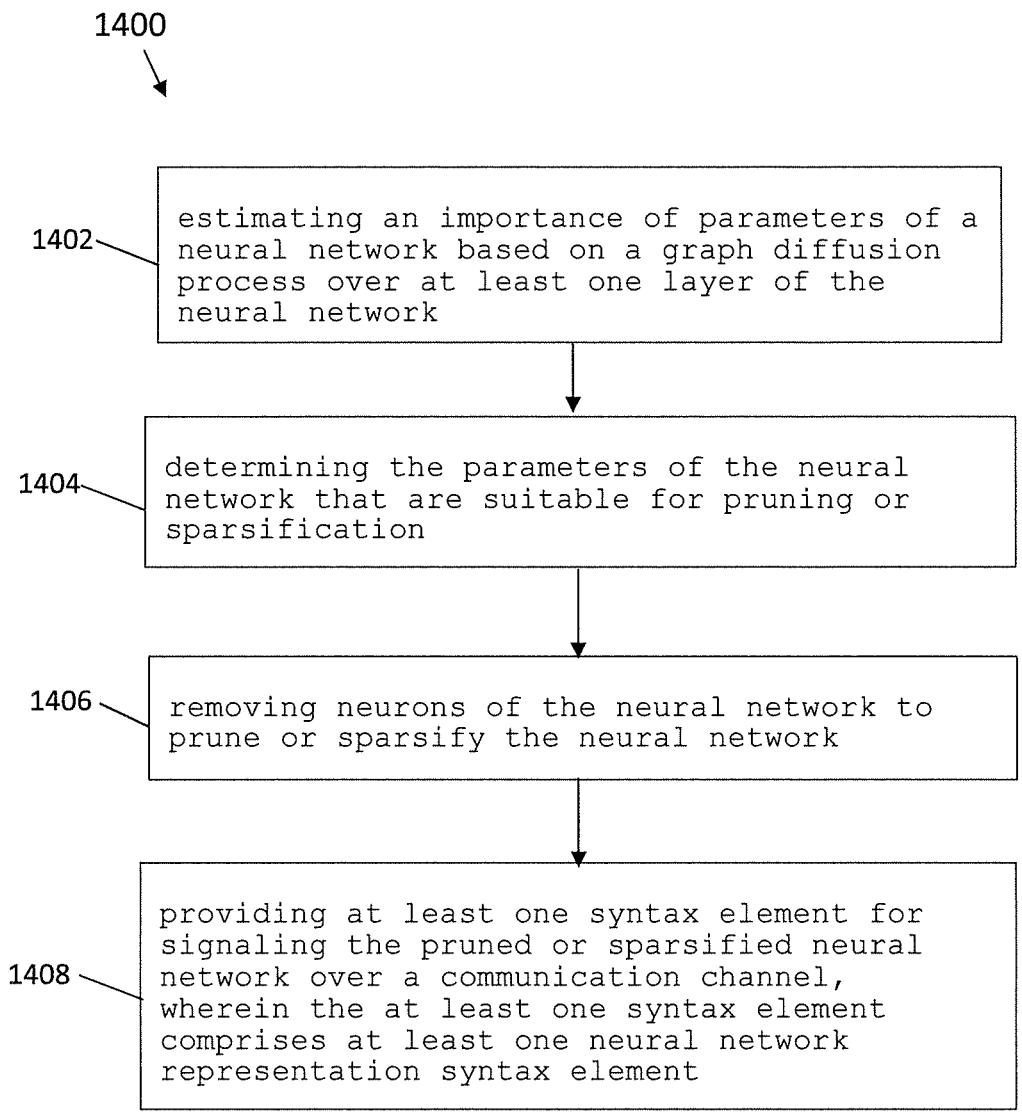
FIG. 14 is an example encoder side method, based on the examples described herein.

FIG. 14 is an example encoder side method, based on the examples described herein. At 1402, the method includes estimating an importance of parameters of a neural network based on a graph diffusion process over at least one layer of the neural network. At 1404, the method includes determining the parameters of the neural network that are suitable for pruning or sparsification. At 1406, the method includes removing neurons of the neural network to prune or sparsify the neural network. At 1408, the method includes providing at least one syntax element for signaling the pruned or sparsified neural network over a communication channel, wherein the at least one syntax element comprises at least one neural network representation syntax element.

Figure 15:
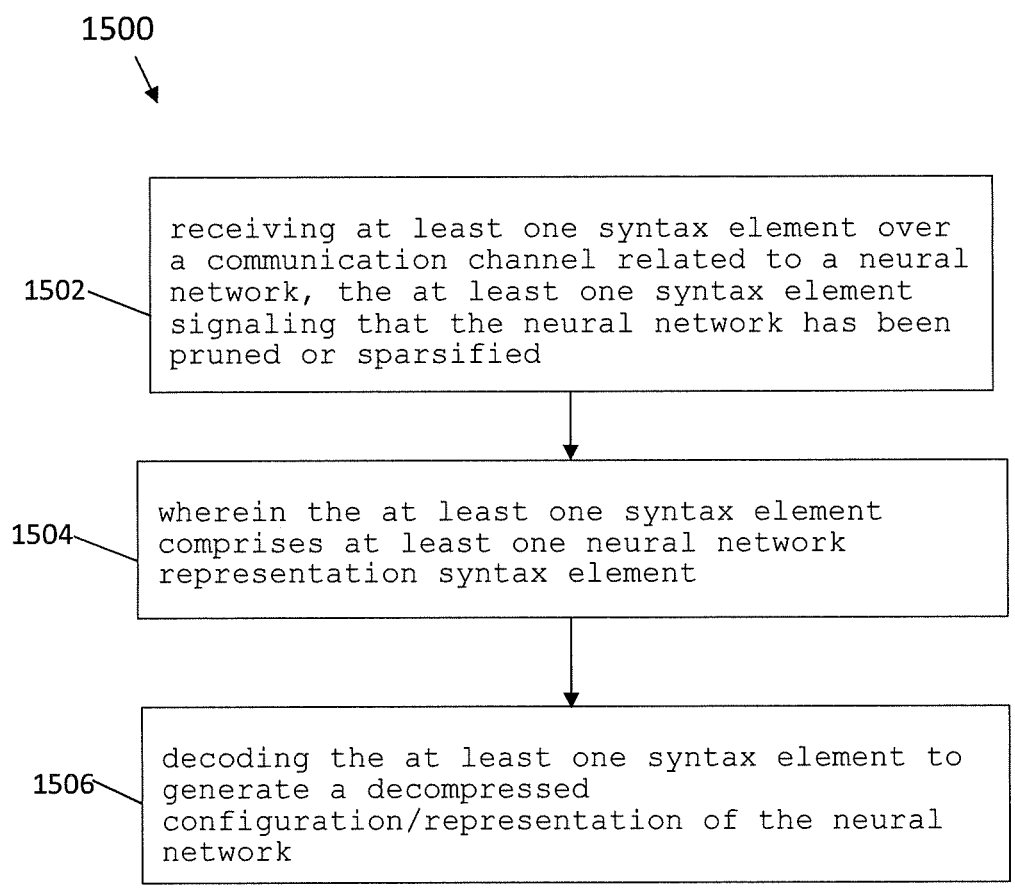
FIG. 15 is an example decoder side method, based on the examples described herein.

FIG. 15 is an example decoder side method, based on the examples described herein. At 1502, the method includes receiving at least one syntax element over a communication channel related to a neural network, the at least one syntax element signaling that the neural network has been pruned or sparsified. At 1504, the method includes wherein the at least one syntax element comprises at least one neural network representation syntax element. At 1506, the method includes decoding the at least one syntax element to generate a decompressed configuration/representation of the neural network.

Figure 16:
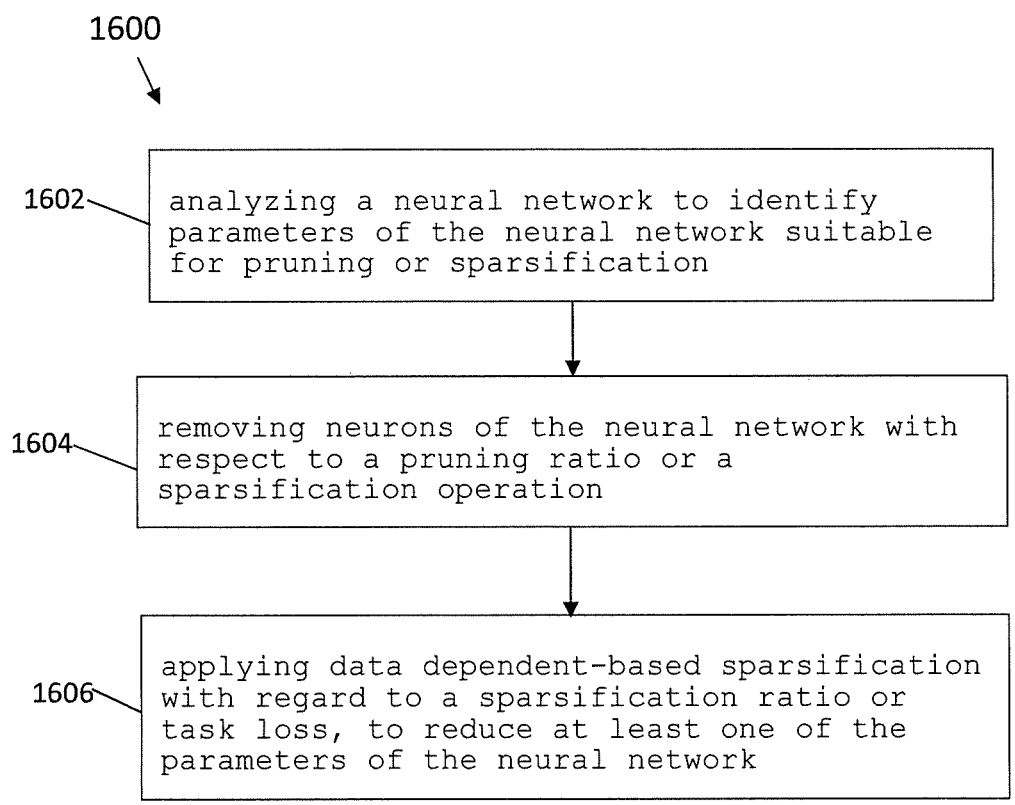
FIG. 16 is an example encoder side method, based on the examples described herein.

FIG. 16 is an example encoder side method, based on the examples described herein. At 1602, the method includes analyzing a neural network to identify parameters of the neural network suitable for pruning or sparsification. At 1604, the method includes removing neurons of the neural network with respect to a pruning ratio or a sparsification operation. At 1606, the method includes applying data dependent-based sparsification with regard to a sparsification ratio or task loss, to reduce at least one of the parameters of the neural network.

References to a 'computer', 'processor', etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used herein, the term 'circuitry', 'circuit' and variants may refer to any of the following: (a) hardware circuit implementations, such as implementations in analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. As a further example, as used herein, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device. Circuitry or circuit may also be used to mean a function or a process used to execute a method.

An example apparatus includes at least one processor; and at least one non-transitory memory including computer program code; wherein the at least one memory and the computer program code are configured to, with the at least one processor, cause the apparatus at least to: determine an importance of neurons at each neural network layer of a neural network utilizing a graph diffusion technique; identify the neurons which are of less importance for the performance of the neural network; remove the neurons of the neural network which are identified as being of less importance for the performance of the neural network to prune the neural network; further fine tune the resulting neural network when a performance improvement is desired; and generate syntax elements for storing and signaling the pruned neural network from a sender to a receiver via a communication channel via defining moving picture experts group neural network representation high level syntax extensions.

The apparatus may further include wherein the apparatus is an encoder.

The apparatus may further include wherein the at least one memory and the computer program code are further configured to, with the at least one processor, cause the apparatus at least to: reshape and form a feature vector at each neural network layer of the neural network in consideration of a shape based on a number of inputs and outputs, and eventually other parameters, of the neural network layer.

The apparatus may further include wherein removing the neurons of the neural network which are identified as being of less importance for the performance of the neural network to prune the neural network comprises either: removing uniformly a certain percentage of filters in each layer of the neural network; removing non-uniformly a certain percentage of filters in each layer of the neural network; or setting weights of a certain percentage of filters in each layer of the neural network to zero.

The apparatus may further include wherein the at least one memory and the computer program code are further configured to, with the at least one processor, cause the apparatus at least to: repeat the pruning and fine-tuning until a desired compression ratio is achieved.

The apparatus may further include wherein the at least one memory and the computer program code are further configured to, with the at least one processor, cause the apparatus at least to: utilize a sparsification loss term as a term in an objective function used for the fine tuning of the resulting neural network; and set weight values of the neural network to zero in response to the weight values being smaller than a threshold.

The apparatus may further include wherein the graph diffusion technique applies to an output of the neurons at each layer, given a data evaluation phase.

The apparatus may further include wherein the removing of neurons comprises removing or setting to zero a single neuron rather than a complete kernel or filter, wherein each neuron weight is considered in the formation of an adjacency matrix and pruning occurs for the single neuron, subject to the removal of the single neuron not creating a disconnection in a computational graph associated with the neural network.

The apparatus may further include wherein the at least one memory and the computer program code are further configured to, with the at least one processor, cause the apparatus at least to: signal the pruned neural network using a bitmask to indicate pruned and non-pruned filters, wherein the bitmask comprises elements including a filter validity mask, a tensor dimension, an order, and a densified weight tensor.

The apparatus may further include wherein the bitmask is entropy coded.

The apparatus may further include wherein the at least one memory and the computer program code are further configured to, with the at least one processor, cause the apparatus at least to: signal the pruned neural network using a dictionary of elements and dimensions, wherein the elements include: a model identifier (ID) to indicate a non-pruned architecture; a data order enumeration to indicate whether data was compressed in a row order or column order; and a name and dimension of the dictionary.

The apparatus may further include wherein the at least one memory and the computer program code are further configured to, with the at least one processor, cause the apparatus at least to: signal the pruned neural network using a delimiter separated configuration string.

The apparatus may further include wherein the defined moving picture experts group neural network representation high level syntax extensions comprise: a pruning flag that specifies whether pruning has been performed on the neural network; and a data ordering flag that if set to 1 indicates that data is to be processed column wise, and if set to 0 indicates the data is to be processed row-major.

The apparatus may further include wherein the defined moving picture experts group neural network representation high level syntax extensions comprise: a topology format container that indicates a topology information update from a pruning algorithm, the topology format container comprising an enumeration indicating how the topology update is provided, the enumeration being either bitmask, dictionary, or configuration string.

The apparatus may further include wherein when the enumeration is bitmask, the topology format container signals: an order bit indicating whether the bitmask is to be processed row-major or column major; a sparse bit indicating whether the bitmask is to be used to sparsify a network topology or prune it; and a validity bit mask indicating a number of bits present, and a byte alignment.

The apparatus may further include wherein when the enumeration is dictionary, the topology format container signals: a count identifier (ID) indicating the number of element identifiers (IDs) that are updated; an element identifier (ID) used to reference an element; a number of dimensions; and an array of dimensions that contain new dimensions of the element.

The apparatus may further include wherein the layers of the neural network are either convolution or fully connected, or the neural network is a recurrent type network.

An example apparatus includes at least one processor; and at least one non-transitory memory including computer program code; wherein the at least one memory and the computer program code are configured to, with the at least one processor, cause the apparatus at least to: receive a bitstream having a payload and a payload syntax element of a pruned neural network; load the payload into memory for further processing; decode the payload for decompressing, running related information of the neural network; and apply a pruning operation on the neural network.

The apparatus may further include wherein the apparatus is a decoder, and wherein the at least one memory and the computer program code are further configured to, with the at least one processor, cause the apparatus at least to: restore a new neural network configuration or a sparse representation of the pruned neural network.

The apparatus may further include wherein the at least one memory and the computer program code are further configured to, with the at least one processor, cause the apparatus at least to: in response to receiving a filter validity bitmask and the neural network being sparsified: uncompress a densified weight tensor into its original form factor; assign elements of the densified weight tensor to their location; and create an original size tensor using a tensor dimension element.

The apparatus may further include wherein the at least one memory and the computer program code are further configured to, with the at least one processor, cause the apparatus at least to: in response to receiving a filter validity bitmask and the neural network being pruned: drop links in an architecture associated with the neural network; restore weight values from a densified weight tensor into an original tensor copy; and rearrange the weight values into a new pruned neural network.

The apparatus may further include wherein the at least one memory and the computer program code are further configured to, with the at least one processor, cause the apparatus at least to: in response to receiving a dictionary of elements and dimensions: assert a model identifier (ID) with an expected architecture; parse the dictionary with elements in the dictionary; recreate tensors with new dimensions; and unpack data into the tensors given a data order provided in the dictionary.

The apparatus may further include wherein the at least one memory and the computer program code are further configured to, with the at least one processor, cause the apparatus at least to: in response to receiving a configuration string: parse the configuration string to reconstruct a model and load a set of weights into memory.

The apparatus may further include wherein the at least one memory and the computer program code are further configured to, with the at least one processor, cause the apparatus at least to: in response to receiving an entropy coded bitmask that signals a neural network topology, decompress the bitmask.

The apparatus may further include wherein the at least one memory and the computer program code are further configured to, with the at least one processor, cause the apparatus at least to: receive a topology payload corresponding to a pruning topology update; check the type of payload and load the payload into memory for processing; in response to the type being bitmask, parse the neural network and drop unnecessary weights or sparsify the network; and in response to the type being dictionary or configuration string, use provided element identifiers (IDs) and their dimensions to reconfigure tensors and if required reconfigure dependent tensors.

The apparatus may further include wherein reconfiguring dependent tensors comprises reconfiguring a number of inputs to a layer from pruned outputs of a previous layer.

The apparatus may further include wherein layers of the neural network are either convolution or fully connected, or the neural network is a recurrent type network.

An example method includes determining an importance of neurons at each neural network layer of a neural network utilizing a graph diffusion technique; identifying the neurons which are of less importance for the performance of the neural network; removing the neurons of the neural network which are identified as being of less importance for the performance of the neural network to prune the neural network; further fine tuning the resulting neural network when a performance improvement is desired; and generating syntax elements for storing and signaling the pruned neural network from a sender to a receiver via a communication channel via defining moving picture experts group neural network representation high level syntax extensions.

An example method includes receiving a bitstream having a payload and a payload syntax element of a pruned neural network; loading the payload into memory for further processing; decoding the payload for decompressing, running related information of the neural network; and applying a pruning operation on the neural network.

An example non-transitory program storage device readable by a machine, tangibly embodying a program of instructions executable by the machine for performing operations may be provided, the operations comprising: determining an importance of neurons at each neural network layer of a neural network utilizing a graph diffusion technique; identifying the neurons which are of less importance for the performance of the neural network; removing the neurons of the neural network which are identified as being of less importance for the performance of the neural network to prune the neural network; further fine tuning the resulting neural network when a performance improvement is desired; and generating syntax elements for storing and signaling the pruned neural network from a sender to a receiver via a communication channel via defining moving picture experts group neural network representation high level syntax extensions.

An example non-transitory program storage device readable by a machine, tangibly embodying a program of instructions executable by the machine for performing operations may be provided, the operations comprising: receiving a bitstream having a payload and a payload syntax element of a pruned neural network; loading the payload into memory for further processing; decoding the payload for decompressing, running related information of the neural network; and applying a pruning operation on the neural network.

An example apparatus includes means for determining an importance of neurons at each neural network layer of a neural network utilizing a graph diffusion technique; means for identifying the neurons which are of less importance for the performance of the neural network; means for removing the neurons of the neural network which are identified as being of less importance for the performance of the neural network to prune the neural network; means for further fine tuning the resulting neural network when a performance improvement is desired; and means for generating syntax elements for storing and signaling the pruned neural network from a sender to a receiver via a communication channel via defining moving picture experts group neural network representation high level syntax extensions.

The apparatus may further include wherein the apparatus is an encoder.

The apparatus may further include means for reshaping and forming a feature vector at each neural network layer of the neural network in consideration of a shape based on a number of inputs and outputs, and eventually other parameters, of the neural network layer.

The apparatus may further include wherein the means for removing the neurons of the neural network which are identified as being of less importance for the performance of the neural network to prune the neural network comprises means for removing uniformly a certain percentage of filters in each layer of the neural network.

The apparatus may further include wherein the means for removing the neurons of the neural network which are identified as being of less importance for the performance of the neural network to prune the neural network comprises means for removing non-uniformly a certain percentage of filters in each layer of the neural network.

The apparatus may further include wherein the means for removing the neurons of the neural network which are identified as being of less importance for the performance of the neural network to prune the neural network comprises means for setting weights of a certain percentage of filters in each layer of the neural network to zero.

The apparatus may further include means for repeating the pruning and fine-tuning until a desired compression ratio is achieved.

The apparatus may further include means for utilizing a sparsification loss term as a term in an objective function used for the fine tuning of the resulting neural network; and means for setting weight values of the neural network to zero in response to the weight values being smaller than a threshold.

The apparatus may further include wherein the graph diffusion technique applies to an output of the neurons at each layer, given a data evaluation phase.

The apparatus may further include wherein the means for removing of neurons comprises means for removing or setting to zero a single neuron rather than a complete kernel or filter, wherein each neuron weight is considered in the formation of an adjacency matrix and pruning occurs for the single neuron, subject to the removal of the single neuron not creating a disconnection in a computational graph associated with the neural network.

The apparatus may further include means for signaling the pruned neural network using a bitmask to indicate pruned and non-pruned filters, wherein the bitmask comprises elements including a filter validity mask, a tensor dimension, an order, and a densified weight tensor.

The apparatus may further include wherein the bitmask is entropy coded.

The apparatus may further include means for signaling the pruned neural network using a dictionary of elements and dimensions, wherein the elements include: a model identifier (ID) to indicate a non-pruned architecture; a data order enumeration to indicate whether data was compressed in a row order or column order; and a name and dimension of the dictionary.

The apparatus may further include means for signaling the pruned neural network using a delimiter separated configuration string.

The apparatus may further include wherein the defined moving picture experts group neural network representation high level syntax extensions comprise: a pruning flag that specifies whether pruning has been performed on the neural network; and a data ordering flag that if set to 1 indicates that data is to be processed column wise, and if set to 0 indicates the data is to be processed row-major.

The apparatus may further include wherein the defined moving picture experts group neural network representatiOn high level syntax extensions comprise: a topology format container that indicates a topology information update from a pruning algorithm, the topology format container comprising an enumeration indicating how the topology update is provided, the enumeration being either bitmask, dictionary, or configuration string.

The apparatus may further include wherein when the enumeration is bitmask, the topology format container signals: an order bit indicating whether the bitmask is to be processed row-major or column major; a sparse bit indicating whether the bitmask is to be used to sparsify a network topology or prune it; and a validity bit mask indicating a number of bits present, and a byte alignment.

The apparatus may further include wherein when the enumeration is dictionary, the topology format container signals: a count identifier (ID) indicating the number of element identifiers (IDs) that are updated; an element identifier (ID) used to reference an element; a number of dimensions; and an array of dimensions that contain new dimensions of the element.

The apparatus may further include wherein the layers of the neural network are either convolution or fully connected, or the neural network is a recurrent type network.

An example apparatus includes means for receiving a bitstream having a payload and a payload syntax element of a pruned neural network; means for loading the payload into memory for further processing; means for decoding the payload for decompressing, running related information of the neural network; and means for applying a pruning operation on the neural network.

The apparatus may further include wherein the apparatus is a decoder, and the apparatus further comprises: means for restoring a new neural network configuration or a sparse representation of the pruned neural network.

The apparatus may further include means for, in response to receiving a filter validity bitmask and the neural network being sparsified: uncompressing a densified weight tensor into its original form factor; assigning elements of the densified weight tensor to their location; and creating an original size tensor using a tensor dimension element.

The apparatus may further include means for, in response to receiving a filter validity bitmask and the neural network being pruned: dropping links in an architecture associated with the neural network; restoring weight values from a densified weight tensor into an original tensor copy; and rearranging the weight values into a new pruned neural network.

The apparatus may further include means for, in response to receiving a dictionary of elements and dimensions: asserting a model identifier (ID) with an expected architecture; parsing the dictionary with elements in the dictionary; recreating tensors with new dimensions; and unpacking data into the tensors given a data order provided in the dictionary.

The apparatus may further include means for, in response to receiving a configuration string: parsing the configuration string to reconstruct a model and load a set of weights into memory.

The apparatus may further include means for, in response to receiving an entropy coded bitmask that signals a neural network topology, decompressing the bitmask.

The apparatus may further include means for receiving a topology payload corresponding to a pruning topology update; means for checking the type of payload and load the payload into memory for processing; means for, in response to the type being bitmask, parsing the neural network and drop unnecessary weights or sparsify the network; and means for, in response to the type being dictionary or configuration string, using provided element identifiers (IDs) and their dimensions to reconfigure tensors and if required reconfigure dependent tensors.

The apparatus may further include wherein reconfiguring dependent tensors comprises reconfiguring a number of inputs to a layer from pruned outputs of a previous layer.

The apparatus may further include wherein layers of the neural network are either convolution or fully connected, or the neural network is a recurrent type network.

An example apparatus includes circuitry configured to determine an importance of neurons at each neural network layer of a neural network utilizing a graph diffusion technique; circuitry configured to identify the neurons which are of less importance for the performance of the neural network; circuitry configured to remove the neurons of the neural network which are identified as being of less importance for the performance of the neural network to prune the neural network; circuitry configured to further fine tune the resulting neural network when a performance improvement is desired; and circuitry configured to generate syntax elements for storing and signaling the pruned neural network from a sender to a receiver via a communication channel via defining moving picture experts group neural network representation high level syntax extensions.

An example apparatus includes circuitry configured to receive a bitstream having a payload and a payload syntax element of a pruned neural network; circuitry configured to load the payload into memory for further processing; circuitry configured to decode the payload for decompressing, running related information of the neural network; and circuitry configured to apply a pruning operation on the neural network.

An example apparatus includes means for estimating an importance of parameters of a neural network based on a graph diffusion process over at least one layer of the neural network; means for determining the parameters of the neural network that are suitable for pruning or sparsification; means for removing neurons of the neural network to prune or sparsify the neural network; and means for providing at least one syntax element for signaling the pruned or sparsified neural network over a communication channel, wherein the at least one syntax element comprises at least one neural network representation syntax element.

The apparatus may further include means for performing the removing of the neurons of the neural network to prune or sparsify the neural network until a target compression ratio is achieved.

The apparatus may further include means for applying data dependent-based sparsification of the neural network with regard to a sparsification ratio or a task loss.

The apparatus may further include wherein the at least one neural network representation syntax element is a flag to indicate a type of output that is produced from the neural network, applied based on a condition of being present.

The apparatus may further include wherein the at least one syntax element comprises a prune flag to indicate pruning is applied, applied based on a condition of being present.

The apparatus may further include wherein the at least one syntax element comprises an order flag to indicate an order of processing of information in row-major or column-major, applied based on a condition of being present.

The apparatus may further include wherein the at least one syntax element comprises a sparse flag to indicate sparsification is applied, applied based on a condition of being present.

The apparatus may further include wherein the at least one syntax element comprises a count identifier indicating a number of elements that are pruned, applied based on a condition of a prune flag being 1 and a neural network representation type being a neural network representation topology dictionary.

The apparatus may further include wherein the at least one syntax element comprises an element identifier of a pruned element, applied based on a condition of a prune flag being 1 and a neural network representation type being a neural network representation topology dictionary.

The apparatus may further include wherein the at least one syntax element comprises a dimension count of a pruned element, applied based on a condition of a prune flag being 1 and a neural network representation type being a neural network representation topology dictionary.

The apparatus may further include wherein the at least one syntax element comprises a dimension comprising at least one new dimension of a pruned element, applied based on a condition of a prune flag being 1 and a neural network representation type being a neural network representation topology dictionary.

The apparatus may further include wherein the at least one syntax element comprises a bitmask to indicate which matrix elements are preserved during sparsification, applied based on a condition of a sparse flag being 1, where a bit value of 1 indicates that a corresponding element is preserved, and a bit value of 0 indicates that the corresponding element is sparsified.

The apparatus may further include wherein the at least one syntax element comprises a bitmask to indicate which matrix elements or output channels are preserved during pruning, applied based on a condition of a prune flag being 1 and a neural network representation type being a neural network representation topology bitmask, where a bit value of 1 indicates that a corresponding element is preserved, and a bit value of 0 indicates that the corresponding element is pruned.

The apparatus may further include wherein the at least one neural network representation syntax element indicates topology pruning information.

The apparatus may further include wherein the at least one neural network representation syntax element indicates at least one neural network representation topology unit payload semantic.

The apparatus may further include wherein the at least one neural network representation topology unit payload semantic comprises a topology storage format value signaled in a corresponding neural network representation topology unit header, wherein the topology storage format value is a neural network representation topology data unit type.

The apparatus may further include wherein the at least one neural network representation topology unit payload semantic comprises a topology data byte sequence of length determined with a neural network representation unit size describing a neural network topology, in a format specified with a topology storage format value.

The apparatus may further include wherein when the topology storage format value is an unrecognized topology format, a topology data structure is used to identify a format of a data payload.

The apparatus may further include wherein the at least one neural network representation topology unit payload semantic comprises a neural network representation type specifying whether pruning information is represented as a bitmask using a neural network representation topology bitmask identifier, or as a dictionary of references of topology elements using a neural network representation topology dictionary.

The apparatus may further include wherein the at least one neural network representation topology unit payload semantic comprises a prune flag that when set to 1 indicates that a pruning step is used during parameter reduction and pruning related topology information is present in a payload.

The apparatus may further include wherein the at least one neural network representation topology unit payload semantic comprises an order flag that when set to 1 indicates that a bitmask should be processed row-major order, and column-major otherwise.

The apparatus may further include wherein the at least one neural network representation topology unit payload semantic comprises a sparse flag that when set to 1 indicates that a sparsification step is used during parameter reduction and related topology information is present in a payload.

The apparatus may further include wherein the at least one neural network representation topology unit payload semantic comprises a count identifier specifying a number of element identifiers that are updated.

The apparatus may further include wherein the at least one neural network representation topology unit payload semantic comprises an element identifier specifying a unique identifier that is used to reference a topology element.

The apparatus may further include wherein the at least one neural network representation topology unit payload semantic comprises an element identifier index specifying a unique index of a topology element which is present in a neural network representation topology unit payload, where a topology storage format value comprises topology element reference list information.

The apparatus may further include wherein the at least one neural network representation topology unit payload semantic comprises a count variable specifying a number of dimensions.

The apparatus may further include wherein the at least one neural network representation topology unit payload semantic comprises a dimension variable specifying an array of dimensions that contain new dimensions for a specified element.

The apparatus may further include wherein the at least one neural network representation topology unit payload semantic comprises a bit mask value that when set to 1 indicates that a weight of a neuron is pruned when a prune flag is set to 1, or is sparsified to set the weight value of the neuron to 0 when a sparse flag is set to 1.

The apparatus may further include wherein the at least one neural network representation topology unit payload semantic comprises a bit count variable that specifies a number of bits present in bitmask information.

The apparatus may further include wherein the at least one neural network representation syntax element indicates at least one neural network representation model parameter set unit payload semantic of a model parameter set of a model.

The apparatus may further include wherein the at least one neural network representation model parameter set unit payload semantic is a model parameter set pruning flag that specifies whether pruning is applied to the model in one or more neural network representation compressed data units that utilize the model parameter set.

The apparatus may further include wherein the at least one neural network representation model parameter set unit payload semantic is a pruning performance map that specifies a mapping between different pruning ratios and resulting neural network inference accuracies.

The apparatus may further include wherein the resulting neural network inference accuracies are provided separately for different aspects or characteristics of an output of the neural network.

The apparatus may further include wherein, for a classifier neural network, the pruning ratios are mapped to separate accuracies for each class, in addition to an overall accuracy which considers a set of classes; and wherein the classes are ordered based on a neural network output order specified during training of the neural network.

The apparatus may further include wherein the at least one neural network representation model parameter set unit payload semantic is a pruning ratio variable that specifies a pruning ratio.

The apparatus may further include wherein the apparatus is an encoder.

The apparatus may further include means for modeling a redundancy in a layer output of the neural network using internal redundant information inside a parameter tensor filter of a convolution layer of the neural network; and means for using graph diffusion to determine the redundancy in the layer output in consideration of a random process between output channels.

The apparatus may further include wherein: the parameter tensor filter is denoted $F \in R^{C_o \times K \times K \times C_i}$, where $C_o$ is a number of output channels, K is a dimension of a convolution kernel, $C_i$ is a number of input channels, and R is a set of real numbers; and the random process is an ergodic Markov process.

The apparatus may further include means for determining a probability of reaching a state at equilibrium based on a stochastic transition matrix and an equilibrium probability corresponding to an eigenvector; and means for determining an importance of a neural network neuron or neural network layer based on a smoothing factor.

The apparatus may further include means for determining the importance as $$S = \exp\left(-\frac{1}{\sigma \pi}\right),$$

where σ is a smoothing factor equal to a number of output channels, m is the probability of reaching a state at equilibrium, and exp is an exponential operation; wherein a higher value of S indicates more dissimilarity, importance and salience for an output channel in comparison to other output channels; means for determining the stochastic transition matrix P as $$p_{ij} = \frac{e^{-D(m_i, m_j)}}{\sum_{z=1}^{C_o} e^{-D(m_i, m_z)}},$$

where $m_i$ is an ith row of a feature matrix M, $m_j$ is a jth column of the feature matrix M, D(.,.) is a distance function, $C_o$ is a number of output channels, and e is a natural logarithm; and means for determining the feature matrix M via tensor reshape.

The apparatus may further include means for removing less salient channels following determining the importance.

An example apparatus includes means for receiving at least one syntax element over a communication channel related to a neural network, the at least one syntax element signaling that the neural network has been pruned or sparsified; wherein the at least one syntax element comprises at least one neural network representation syntax element; and means for decoding the at least one syntax element to generate a decompressed configuration/representation of the neural network.

The apparatus may further include wherein the at least one neural network representation syntax element is a flag to indicate a type of output that is produced from the neural network, applied based on a condition of being present.

The apparatus may further include wherein the at least one syntax element comprises a prune flag to indicate pruning is applied, applied based on a condition of being present.

The apparatus may further include wherein the at least one syntax element comprises an order flag to indicate an order of processing of information in row-major or column-major, applied based on a condition of being present.

The apparatus may further include wherein the at least one syntax element comprises a sparse flag to indicate sparsification is applied, applied based on a condition of being present.

The apparatus may further include wherein the at least one syntax element comprises a count identifier indicating a number of elements that are pruned, applied based on a condition of a prune flag being 1 and a neural network representation type being a neural network representation topology dictionary.

The apparatus may further include wherein the at least one syntax element comprises an element identifier of a pruned element, applied based on a condition of a prune flag being 1 and a neural network representation type being a neural network representation topology dictionary.

The apparatus may further include wherein the at least one syntax element comprises a dimension count of a pruned element, applied based on a condition of a prune flag being 1 and a neural network representation type being a neural network representation topology dictionary.

The apparatus may further include wherein the at least one syntax element comprises a dimension comprising at least one new dimension of a pruned element, applied based on a condition of a prune flag being 1 and a neural network representation type being a neural network representation topology dictionary.

The apparatus may further include wherein the at least one syntax element comprises a bitmask to indicate which matrix elements are preserved during sparsification, applied based on a condition of a sparse flag being 1, where a bit value of 1 indicates that a corresponding element is preserved, and a bit value of 0 indicates that the corresponding element is sparsified.

The apparatus may further include wherein the at least one syntax element comprises a bitmask to indicate which matrix elements or output channels are preserved during pruning, applied based on a condition of a prune flag being 1 and a neural network representation type being a neural network representation topology bitmask, where a bit value of 1 indicates that a corresponding element is preserved, and a bit value of 0 indicates that the corresponding element is pruned.

The apparatus may further include wherein the at least one neural network representation syntax element indicates topology pruning information.

The apparatus may further include wherein the at least one neural network representation syntax element indicates at least one neural network representation topology unit payload semantic.

The apparatus may further include wherein the at least one neural network representation topology unit payload semantic comprises a topology storage format value signaled in a corresponding neural network representation topology unit header, wherein the topology storage format value is a neural network representation topology data unit type.

The apparatus may further include wherein the at least one neural network representation topology unit payload semantic comprises a topology data byte sequence of length determined with a neural network representation unit size describing a neural network topology, in a format specified with a topology storage format value.

The apparatus may further include wherein when the topology storage format value is an unrecognized topology format, a topology data structure is used to identify a format of a data payload.

The apparatus may further include wherein the at least one neural network representation topology unit payload semantic comprises a neural network representation type specifying whether pruning information is represented as a bitmask using a neural network representation topology bitmask identifier, or as a dictionary of references of topology elements using a neural network representation topology dictionary.

The apparatus may further include wherein the at least one neural network representation topology unit payload semantic comprises a prune flag that when set to 1 indicates that a pruning step is used during parameter reduction and pruning related topology information is present in a payload.

The apparatus may further include wherein the at least one neural network representation topology unit payload semantic comprises an order flag that when set to 1 indicates that a bitmask should be processed row-major order, and column-major otherwise.

The apparatus may further include wherein the at least one neural network representation topology unit payload semantic comprises a sparse flag that when set to 1 indicates that a sparsification step is used during parameter reduction and related topology information is present in a payload.

The apparatus may further include wherein the at least one neural network representation topology unit payload semantic comprises a count identifier specifying a number of element identifiers that are updated.

The apparatus may further include wherein the at least one neural network representation topology unit payload semantic comprises an element identifier specifying a unique identifier that is used to reference a topology element.

The apparatus may further include wherein the at least one neural network representation topology unit payload semantic comprises an element identifier index specifying a unique index of a topology element which is present in a neural network representation topology unit payload, where a topology storage format value comprises topology element reference list information.

The apparatus may further include wherein the at least one neural network representation topology unit payload semantic comprises a count variable specifying a number of dimensions.

The apparatus may further include wherein the at least one neural network representation topology unit payload semantic comprises a dimension variable specifying an array of dimensions that contain new dimensions for a specified element.

The apparatus may further include wherein the at least one neural network representation topology unit payload semantic comprises a bit mask value that when set to 1 indicates that a weight of a neuron is pruned when a prune flag is set to 1, or is sparsified to set the weight value of the neuron to 0 when a sparse flag is set to 1.

The apparatus may further include wherein the at least one neural network representation topology unit payload semantic comprises a bit count variable that specifies a number of bits present in bitmask information.

The apparatus may further include wherein the at least one neural network representation syntax element indicates at least one neural network representation model parameter set unit payload semantic of a model parameter set of a model.

The apparatus may further include wherein the at least one neural network representation model parameter set unit payload semantic is a model parameter set pruning flag that specifies whether pruning is applied to the model in one or more neural network representation compressed data units that utilize the model parameter set.

The apparatus may further include wherein the at least one neural network representation model parameter set unit payload semantic is a pruning performance map that specifies a mapping between different pruning ratios and resulting neural network inference accuracies.

The apparatus may further include wherein the resulting neural network inference accuracies are provided separately for different aspects or characteristics of an output of the neural network.

The apparatus may further include wherein, for a classifier neural network, the pruning ratios are mapped to separate accuracies for each class, in addition to an overall accuracy which considers a set of classes; and wherein the classes are ordered based on a neural network output order specified during training of the neural network.

The apparatus may further include wherein the at least one neural network representation model parameter set unit payload semantic is a pruning ratio variable that specifies a pruning ratio.

An example apparatus includes means for analyzing a neural network to identify parameters of the neural network suitable for pruning or sparsification; means for removing neurons of the neural network with respect to a pruning ratio or a sparsification operation; and means for applying data dependent-based sparsification with regard to a sparsification ratio or task loss, to reduce at least one of the parameters of the neural network.

The apparatus may further include means for performing the analyzing, the removing, and the applying until a target compression ratio is achieved.

The apparatus may further include wherein the removing of the neurons of the neural network is performed using the sparsification operation.

The apparatus may further include wherein the applying of the data dependent-based sparsification is performed in consideration of the task loss.

The apparatus may further include means for estimating the parameters of the neural network based on a diffusion process over the layers of the neural network.

The apparatus may further include means for modeling a redundancy in a layer output of the neural network using internal redundant information inside a parameter tensor filter of a convolution layer of the neural network; and means for using graph diffusion to determine the redundancy in the layer output in consideration of a random process between output channels.

The apparatus may further include wherein: the parameter tensor filter is denoted $F \in R^{C_o \times K \times K \times C_i}$, is a number of output channels, K is a dimension of a convolution kernel, $C_i$ is a number of input channels, and R is a set of real numbers; and the random process is an ergodic Markov process.

The apparatus may further include means for determining a probability of reaching a state at equilibrium based on a stochastic transition matrix and an equilibrium probability corresponding to an eigenvector; and means for determining an importance of a neural network neuron or neural network layer based on a smoothing factor.

The apparatus may further include means for determining the importance as $$S = \exp\left(-\frac{1}{\sigma\pi}\right),$$

where σ is a smoothing factor equal to a number of output channels, π is the probability of reaching a state at equilibrium, and exp is an exponential operation; wherein a higher value of S indicates more dissimilarity, importance and salience for an output channel in comparison to other output channels; means for determining the stochastic transition matrix P as $$p_{ij} = \frac{e^{-D(m_i, m_j)}}{\sum_{z=1}^{C_o} e^{-D(m_i, m_z)}},$$

where $m_i$ is an ith row of a feature matrix M, $m_j$ is a jth column of the feature matrix M, $D(.,.)$ is a distance function, $C_o$ is a number of output channels, and e is a natural logarithm; and means for determining the feature matrix M via tensor reshape.

The apparatus may further include means for removing less salient channels following determining the importance.

The apparatus may further include means for providing at least one syntax element for signaling a pruned or sparsified neural network over a communication channel, wherein the at least one syntax element comprises at least one neural network representation syntax element.

An example apparatus includes at least one processor; and at least one non-transitory memory including computer program code; wherein the at least one memory and the computer program code are configured to, with the at least one processor, cause the apparatus at least to: estimate an importance of parameters of a neural network based on a graph diffusion process over at least one layer of the neural network; determine the parameters of the neural network that are suitable for pruning or sparsification; remove neurons of the neural network to prune or sparsify the neural network; and provide at least one syntax element for signaling the pruned or sparsified neural network over a communication channel, wherein the at least one syntax element comprises at least one neural network representation syntax element.

The apparatus may further include wherein the at least one memory and the computer program code are further configured to, with the at least one processor, cause the apparatus at least to: perform the removing of the neurons of the neural network to prune or sparsify the neural network until a target compression ratio is achieved.

The apparatus may further include wherein the at least one memory and the computer program code are further configured to, with the at least one processor, cause the apparatus at least to: apply data dependent-based sparsification of the neural network with regard to a sparsification ratio or a task loss.

The apparatus may further include wherein the at least one neural network representation syntax element is a flag to indicate a type of output that is produced from the neural network, applied based on a condition of being present.

The apparatus may further include wherein the syntax element comprises at least one of: a prune flag to indicate pruning is applied, applied based on a condition of being present; an order flag to indicate an order of processing of information in row-major or column-major, applied based on a condition of being present; a sparse flag to indicate sparsification is applied, applied based on a condition of being present; a count identifier indicating a number of elements that are pruned, applied based on a condition of the prune flag being 1 and a neural network representation type being a neural network representation topology dictionary; an element identifier of a pruned element, applied based on a condition of the prune flag being 1 and the neural network representation type being a neural network representation topology dictionary; a dimension count of a pruned element, applied based on a condition of the prune flag being 1 and the neural network representation type being a neural network representation topology dictionary; a dimension comprising at least one new dimension of a pruned element, applied based on a condition of the prune flag being 1 and the neural network representation type being a neural network representation topology dictionary; a bitmask to indicate which matrix elements are preserved during sparsification, applied based on a condition of the sparse flag being 1, where a bit value of 1 indicates that a corresponding element is preserved, and a bit value of 0 indicates that the corresponding element is sparsified; or a bitmask to indicate which matrix elements or output channels are preserved during pruning, applied based on a condition of the prune flag being 1 and the neural network representation type being a neural network representation topology bitmask, where a bit value of 1 indicates that a corresponding element is preserved, and a bit value of 0 indicates that the corresponding element is pruned.

The apparatus may further include wherein the at least one neural network representation syntax element indicates topology pruning information.

The apparatus may further include wherein the at least one neural network representation syntax element indicates at least one neural network representation topology unit payload semantic comprising at least one of: a topology storage format value signaled in a corresponding neural network representation topology unit header, wherein the topology storage format value is a neural network representation topology data unit type, wherein when the topology storage format value is an unrecognized topology format, a topology data structure is used to identify a format of a data payload; a topology data byte sequence of length determined with a neural network representation unit size describing a neural network topology, in a format specified with the topology storage format value; a neural network representation type specifying whether pruning information is represented as a bitmask using a neural network representation topology bitmask identifier, or as a dictionary of references of topology elements using a neural network representation topology dictionary; a prune flag that when set to 1 indicates that a pruning step is used during parameter reduction and pruning related topology information is present in a payload; an order flag that when set to 1 indicates that a bitmask should be processed row-major order, and column-major otherwise; a sparse flag that when set to 1 indicates that a sparsification step is used during parameter reduction and related topology information is present in the payload; a count identifier specifying a number of element identifiers that are updated; an element identifier specifying a unique identifier that is used to reference a topology element; an element identifier index specifying a unique index of a topology element which is present in a neural network representation topology unit payload, where a topology storage format value comprises topology element reference list information; a count variable specifying a number of dimensions; a dimension variable specifying an array of dimensions that contain new dimensions for a specified element; a bit mask value that when set to 1 indicates that a weight of a neuron is pruned when the prune flag is set to 1, or is sparsified to set the weight value of the neuron to 0 when the sparse flag is set to 1; or a bit count variable that specifies a number of bits present in bitmask information.

The apparatus may further include wherein the at least one neural network representation syntax element indicates at least one neural network representation model parameter set unit payload semantic of a model parameter set of a model, the at least one neural network representation model parameter set unit payload semantic comprising at least one of: a model parameter set pruning flag that specifies whether pruning is applied to the model in one or more neural network representation compressed data units that utilize the model parameter set; a pruning performance map that specifies a mapping between different pruning ratios and resulting neural network inference accuracies, wherein the resulting neural network inference accuracies are provided separately for different aspects or characteristics of an output of the neural network; or a pruning ratio variable that specifies a pruning ratio.

The apparatus may further include wherein, for a classifier neural network, the pruning ratios are mapped to separate accuracies for each class, in addition to an overall accuracy which considers a set of classes; and wherein the classes are ordered based on a neural network output order specified during training of the neural network.

The apparatus may further include wherein the apparatus is an encoder.

An example apparatus includes at least one processor; and at least one non-transitory memory including computer program code; wherein the at least one memory and the computer program code are configured to, with the at least one processor, cause the apparatus at least to: receive at least one syntax element over a communication channel related to a neural network, the at least one syntax element signaling that the neural network has been pruned or sparsified; wherein the at least one syntax element comprises at least one neural network representation syntax element; and decode the at least one syntax element to generate a decompressed configuration/representation of the neural network.

The apparatus may further include wherein the at least one neural network representation syntax element is a flag to indicate a type of output that is produced from the neural network, applied based on a condition of being present.

The apparatus may further include wherein the syntax element comprises at least one of: a prune flag to indicate pruning is applied, applied based on a condition of being present; an order flag to indicate an order of processing of information in row-major or column-major, applied based on a condition of being present; a sparse flag to indicate sparsification is applied, applied based on a condition of being present; a count identifier indicating a number of elements that are pruned, applied based on a condition of the prune flag being 1 and a neural network representation type being a neural network representation topology dictionary; an element identifier of a pruned element, applied based on a condition of the prune flag being 1 and the neural network representation type being a neural network representation topology dictionary; a dimension count of a pruned element, applied based on a condition of the prune flag being 1 and the neural network representation type being a neural network representation topology dictionary; a dimension comprising at least one new dimension of a pruned element, applied based on a condition of the prune flag being 1 and the neural network representation type being a neural network representation topology dictionary; a bitmask to indicate which matrix elements are preserved during sparsification, applied based on a condition of the sparse flag being 1, where a bit value of 1 indicates that a corresponding element is preserved, and a bit value of 0 indicates that the corresponding element is sparsified; or a bitmask to indicate which matrix elements or output channels are preserved during pruning, applied based on a condition of the prune flag being 1 and the neural network representation type being a neural network representation topology bitmask, where a bit value of 1 indicates that a corresponding element is preserved, and a bit value of 0 indicates that the corresponding element is pruned.

The apparatus may further include wherein the at least one neural network representation syntax element indicates topology pruning information.

The apparatus may further include wherein the at least one neural network representation syntax element indicates at least one neural network representation topology unit payload semantic comprising at least one of: a topology storage format value signaled in a corresponding neural network representation topology unit header, wherein the topology storage format value is a neural network representation topology data unit type, wherein when the topology storage format value is an unrecognized topology format, a topology data structure is used to identify a format of a data payload; a topology data byte sequence of length determined with a neural network representation unit size describing a neural network topology, in a format specified with the topology storage format value; a neural network representation type specifying whether pruning information is represented as a bitmask using a neural network representation topology bitmask identifier, or as a dictionary of references of topology elements using a neural network representation topology dictionary; a prune flag that when set to 1 indicates that a pruning step is used during parameter reduction and pruning related topology information is present in a payload; an order flag that when set to 1 indicates that a bitmask should be processed row-major order, and column-major otherwise; a sparse flag that when set to 1 indicates that a sparsification step is used during parameter reduction and related topology information is present in the payload; a count identifier specifying a number of element identifiers that are updated; an element identifier specifying a unique identifier that is used to reference a topology element; an element identifier index specifying a unique index of a topology element which is present in a neural network representation topology unit payload, where a topology storage format value comprises topology element reference list information; a count variable specifying a number of dimensions; a dimension variable specifying an array of dimensions that contain new dimensions for a specified element; a bit mask value that when set to 1 indicates that a weight of a neuron is pruned when the prune flag is set to 1, or is sparsified to set the weight value of the neuron to 0 when the sparse flag is set to 1; or a bit count variable that specifies a number of bits present in bitmask information.

The apparatus may further include wherein the at least one neural network representation syntax element indicates at least one neural network representation model parameter set unit payload semantic of a model parameter set of a model, the at least one neural network representation model parameter set unit payload semantic comprising at least one of: a model parameter set pruning flag that specifies whether pruning is applied to the model in one or more neural network representation compressed data units that utilize the model parameter set; a pruning performance map that specifies a mapping between different pruning ratios and resulting neural network inference accuracies, wherein the resulting neural network inference accuracies are provided separately for different aspects or characteristics of an output of the neural network; or a pruning ratio variable that specifies a pruning ratio.

The apparatus may further include wherein, for a classifier neural network, the pruning ratios are mapped to separate accuracies for each class, in addition to an overall accuracy which considers a set of classes; and wherein the classes are ordered based on a neural network output order specified during training of the neural network.

An example apparatus includes at least one processor; and at least one non-transitory memory including computer program code; wherein the at least one memory and the computer program code are configured to, with the at least one processor, cause the apparatus at least to: analyze a neural network to identify parameters of the neural network suitable for pruning or sparsification; remove neurons of the neural network with respect to a pruning ratio or a sparsification operation; and apply data dependent-based sparsification with regard to a sparsification ratio or task loss, to reduce at least one of the parameters of the neural network.

The apparatus may further include wherein the at least one memory and the computer program code are further configured to, with the at least one processor, cause the apparatus at least to: perform the analyzing, the removing, and the applying until a target compression ratio is achieved.

The apparatus may further include wherein the at least one memory and the computer program code are configured to, with the at least one processor, cause the apparatus at least to: provide at least one syntax element for signaling a pruned or sparsified neural network over a communication channel, wherein the at least one syntax element comprises at least one neural network representation syntax element.

It should be understood that the foregoing description is only illustrative. Various alternatives and modifications may be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

As used herein, "/" may be interpreted as either "or", "and", or "both". Additionally, the following acronyms and abbreviations that may be found in the specification and/or the drawing figures are defined as follows:

3GPP 3rd Generation Partnership Project
4G fourth generation of broadband cellular network technology
5G fifth generation cellular network technology
802.x family of IEEE standards dealing with local area networks and metropolitan area networks
a.k.a. or aka also known as
ASIC application specific circuit
BNF Backus-Naur form
CDMA code-division multiple access
CE core experiment
ConvNets convolutional neural networks
DCT discrete cosine transform
DSP digital signal processor
enum enumeration
FDIS final draft international standard
FDMA frequency division multiple access
FPGA field-programmable gate array
GSM Global System for Mobile communications
H.222.0 MPEG-2 Systems, standard for the generic coding of moving pictures and associated audio information
H.26x family of video coding standards in the domain of the ITU-T
HLS high-level syntax
IBC intra block copy
ICML International Conference on Machine Learning
ICLR International Conference on Learning Representations
ID or id identifier
IEC International Electrotechnical Commission
IEEE Institute of Electrical and Electronics Engineers
I/F interface
IMD integrated messaging device
IMS instant messaging service
I/O input output
IoT internet of things
IP internet protocol
ISO International Organization for Standardization
ISOBMFF ISO base media file format
ITU International Telecommunication Union
ITU-T ITU Telecommunication Standardization Sector
JTC joint technical committee
KDD Knowledge Discovery in Databases
LTE long-term evolution
MMS multimedia messaging service
MPEG moving picture experts group
MPEG-2H.222/H.262 as defined by the ITU
NAL network abstraction layer
NCTM Neural Network Compression Test Model
NN neural network
NNEF Neural Network Exchange Format
NNR neural network representation(s)
NW network
ONNX Open Neural Network Exchange
PC personal computer
PDA personal digital assistant
PID packet identifier
PLC power line connection
RFC request for comnent
RFID radio frequency identification
RFM reference frame memory
SC standardization subcommittee
SMS short messaging service
Str(v) string Exp-Golomb-coded syntax element
SVD singular value decomposition
TCP-IP transmission control protocol-internet protocol
TDMA time divisional multiple access
TS transport stream
TV television
UICC universal integrated circuit card
UMTS Universal Mobile Telecommunications System
u(n) unsigned integer using n bits
URL uniform resource locator
USB universal serial bus
VGG visual geometry group. University of Oxford
VGG16 convolutional neural network model from the University of Oxford in the paper "Very Deep Convolutional Networks for Large-Scale Image Recognition"
WD working draft
WG working group
WLAN wireless local area network

What is claimed is:

1. An apparatus comprising:
   at least one processor; and
   at least one memory storing instructions that, when executed by the at least one processor, cause the apparatus at least to:
   estimate an importance of parameters of a neural network based on a graph diffusion process over at least one layer of the neural network;
   determine the parameters of the neural network for pruning and sparsification, based on the importance of the parameters of the neural network estimated based on the graph diffusion process;
   remove neurons of the neural network to prune the neural network, based on the parameters of the neural network determined for pruning;
   apply data dependent-based sparsification of the neural network with regard to a sparsification ratio to set a value of at least one weight of the neural network to zero; and
   provide, to a receiver, at least one syntax element for signaling the pruned and sparsified neural network, wherein the at least one syntax element comprises at least one neural network representation syntax element;
   wherein the at least one syntax element comprises a sparse flag to indicate sparsification is applied.

2. The apparatus of claim 1, wherein the apparatus is further caused to:
   perform the removing of the neurons of the neural network to prune or sparsify the neural network until a target compression ratio is achieved.

3. The apparatus of claim 1, wherein:
   the at least one syntax element comprises a prune flag to indicate pruning is applied, and
   the at least one neural network representation syntax element indicates at least one neural network representation topology unit payload semantic comprising the prune flag that when set to 1 indicates that a pruning step is used during parameter reduction and pruning related topology information is present in a payload.

4. The apparatus of claim 1, wherein the at least one neural network representation syntax element is a flag to indicate a type of output that is produced from the neural network, applied based on a condition of being present.

5. The apparatus of claim 1, wherein the at least one syntax element comprises at least one of:
   an order flag to indicate an order of processing of information in row-major or column-major, applied based on a condition of being present;
   a count identifier indicating a number of elements that are pruned, applied based on a condition of a prune flag being 1 and a neural network representation type being a neural network representation topology dictionary;
   an element identifier of a pruned element, applied based on a condition of the prune flag being 1 and the neural network representation type being a neural network representation topology dictionary;
   a dimension count of a pruned element, applied based on a condition of the prune flag being 1 and the neural network representation type being a neural network representation topology dictionary; or
   a dimension comprising at least one new dimension of a pruned element, applied based on a condition of the prune flag being 1 and the neural network representation type being a neural network representation topology dictionary.

6. The apparatus of claim 1, wherein the at least one neural network representation syntax element indicates topology pruning information.

7. The apparatus of claim 1, wherein the at least one neural network representation syntax element indicates at least one neural network representation topology unit payload semantic comprising at least one of:
   a topology storage format value signaled in a corresponding neural network representation topology unit header, wherein the topology storage format value is a neural network representation topology data unit type, wherein when the topology storage format value is an unrecognized topology format, a topology data structure is used to identify a format of a data payload;
   a topology data byte sequence of length determined with a neural network representation unit size describing a neural network topology, in a format specified with the topology storage format value;
   an order flag that when set to 1 indicates that a bitmask should be processed row-major order, and column-major otherwise;
   the sparse flag that when set to 1 indicates that a sparsification step is used during parameter reduction and related topology information is present in the payload;
   a count identifier specifying a number of element identifiers that are updated;
   an element identifier specifying a unique identifier that is used to reference a topology element;
   an element identifier index specifying a unique index of a topology element which is present in a neural network representation topology unit payload, where a topology storage format value comprises topology element reference list information;
   a count variable specifying a number of dimensions;
   a dimension variable specifying an array of dimensions that contain new dimensions for a specified element;
   a bit mask value that when set to 1 indicates that a weight of a neuron is pruned when the prune flag is set to 1, or is sparsified to set the weight value of the neuron to 0 when the sparse flag is set to 1; or
   a bit count variable that specifies a number of bits present in bitmask information.

8. The apparatus of claim 1, wherein the at least one neural network representation syntax element indicates at least one neural network representation model parameter set unit payload semantic of a model parameter set of a model, the at least one neural network representation model parameter set unit payload semantic comprising at least one of:
   a model parameter set pruning flag that specifies whether pruning is applied to the model in one or more neural network representation compressed data units that utilize the model parameter set;
   a pruning performance map that specifies a mapping between different pruning ratios and resulting neural network inference accuracies, wherein the resulting neural network inference accuracies are provided separately for different aspects or characteristics of an output of the neural network; or
   a pruning ratio variable that specifies a pruning ratio.

9. The apparatus of claim 8,
   wherein, for a classifier neural network, the pruning ratios are mapped to separate accuracies for each class, in addition to an overall accuracy which considers a set of classes; and
   wherein the classes are ordered based on a neural network output order specified during training of the neural network.

10. The apparatus of claim 1, wherein the apparatus is an encoder.

11. The apparatus of claim 1, wherein the at least one neural network representation syntax element indicates at least one neural network representation topology unit payload semantic comprising a neural network representation type specifying whether pruning information is represented as a bitmask using a neural network representation topology bitmask identifier, or as a dictionary of references of topology elements using a neural network representation topology dictionary.

12. The apparatus of claim 1, wherein the importance of the parameters of the neural network are estimated using a transition matrix P used to determine a probability of reaching a state, wherein elements $p_{i,j}$ of the transition matrix P are determined as $$p_{i,j} = \frac{e^{-D(m_i,m_j)}}{\sum_{z=1}^{C_{out}} e^{-D(m_i,m_z)}},$$

where $m_i$ is an i-th row of a feature matrix M, $m_j$ is a j-th column of the feature matrix M, D (·,·) is a distance function, and $C_o$ is a number of output channels of the neural network.

13. The apparatus of claim 1, wherein:
the at least one neural network representation syntax element indicates at least one neural network representation topology unit payload semantic comprising a topology storage format value signaled in a corresponding neural network representation topology unit header, and
the topology storage format value describes a topology of the neural network.

14. The apparatus of claim 1, wherein the at least one syntax element comprises a sparsification bitmask to indicate which matrix elements are preserved during sparsification, applied based on a condition of the sparse flag being 1, where a bit value of 1 within the sparsification bitmask indicates that a corresponding element is preserved, and a bit value of 0 within the sparsification bitmask indicates that the corresponding element is sparsified.

15. The apparatus of claim 1, wherein the at least one syntax element comprises a pruning bitmask to indicate which matrix elements or output channels are preserved during pruning, applied based on a condition of a prune flag being 1 and a neural network representation type being a neural network representation topology bitmask, where a bit value of 1 within the pruning bitmask indicates that a corresponding element is preserved, and a bit value of 0 within the pruning bitmask indicates that the corresponding element is pruned.

16. An apparatus comprising:
at least one processor; and
at least one memory storing instructions that, when executed by the at least one processor, cause the apparatus at least to:
receive, from a sender, at least one syntax element over a communication channel related to a neural network, the at least one syntax element signaling that the neural network has been pruned and sparsified;
wherein the at least one syntax element comprises a sparse flag to indicate sparsification is applied;
wherein the at least one syntax element comprises at least one neural network representation syntax element; and
decode the at least one syntax element to generate a decompressed configuration or representation of the neural network;
wherein the decompressed configuration or representation of the neural network is generated based on decoding the at least one syntax element to generate decompressed data which complies with a neural network representation decompressed data format.

17. The apparatus of claim 16, wherein the at least one neural network representation syntax element is a flag to indicate a type of output that is produced from the neural network, applied based on a condition of being present.

18. The apparatus of claim 16, wherein the at least one syntax element comprises at least one of:
a prune flag to indicate pruning is applied, applied based on a condition of being present;
an order flag to indicate an order of processing of information in row-major or column-major, applied based on a condition of being present;
a count identifier indicating a number of elements that are pruned, applied based on a condition of the prune flag being 1 and a neural network representation type being a neural network representation topology dictionary;
an element identifier of a pruned element, applied based on a condition of the prune flag being 1 and the neural network representation type being a neural network representation topology dictionary;
a dimension count of a pruned element, applied based on a condition of the prune flag being 1 and the neural network representation type being a neural network representation topology dictionary;
a dimension comprising at least one new dimension of a pruned element, applied based on a condition of the prune flag being 1 and the neural network representation type being a neural network representation topology dictionary;
a sparsification bitmask to indicate which matrix elements are preserved during sparsification, applied based on a condition of the sparse flag being 1, where a bit value of 1 within the sparsification bitmask indicates that a corresponding element is preserved, and a bit value of 0 within the sparsification bitmask indicates that the corresponding element is sparsified; or
a pruning bitmask to indicate which matrix elements or output channels are preserved during pruning, applied based on a condition of the prune flag being 1 and the neural network representation type being a neural network representation topology bitmask, where a bit value of 1 within the pruning bitmask indicates that a corresponding element is preserved, and a bit value of 0 within the pruning bitmask indicates that the corresponding element is pruned.

19. The apparatus of claim 16, wherein the at least one neural network representation syntax element indicates topology pruning information.

20. The apparatus of claim 16, wherein the at least one neural network representation syntax element indicates at least one neural network representation topology unit payload semantic comprising at least one of:
a topology storage format value signaled in a corresponding neural network representation topology unit header, wherein the topology storage format value is a neural network representation topology data unit type, wherein when the topology storage format value is an unrecognized topology format, a topology data structure is used to identify a format of a data payload;

a topology data byte sequence of length determined with a neural network representation unit size describing a neural network topology, in a format specified with the topology storage format value;

a neural network representation type specifying whether pruning information is represented as a bitmask using a neural network representation topology bitmask identifier, or as a dictionary of references of topology elements using a neural network representation topology dictionary;

a prune flag that when set to 1 indicates that a pruning step is used during parameter reduction and pruning related topology information is present in a payload;

an order flag that when set to 1 indicates that a bitmask should be processed row-major order, and column-major otherwise;

the sparse flag that when set to 1 indicates that a sparsification step is used during parameter reduction and related topology information is present in the payload;

a count identifier specifying a number of element identifiers that are updated;

an element identifier specifying a unique identifier that is used to reference a topology element;

an element identifier index specifying a unique index of a topology element which is present in a neural network representation topology unit payload, where a topology storage format value comprises topology element reference list information;

a count variable specifying a number of dimensions;

a dimension variable specifying an array of dimensions that contain new dimensions for a specified element;

a bit mask value that when set to 1 indicates that a weight of a neuron is pruned when the prune flag is set to 1, or is sparsified to set the weight value of the neuron to 0 when the sparse flag is set to 1; or a bit count variable that specifies a number of bits present in bitmask information.

21. The apparatus of claim 16, wherein the at least one neural network representation syntax element indicates at least one neural network representation model parameter set unit payload semantic of a model parameter set of a model, the at least one neural network representation model parameter set unit payload semantic comprising at least one of:

a model parameter set pruning flag that specifies whether pruning is applied to the model in one or more neural network representation compressed data units that utilize the model parameter set;

a pruning performance map that specifies a mapping between different pruning ratios and resulting neural network inference accuracies, wherein the resulting neural network inference accuracies are provided separately for different aspects or characteristics of an output of the neural network; or a pruning ratio variable that specifies a pruning ratio.

22. The apparatus of claim 21, wherein, for a classifier neural network, the pruning ratios are mapped to separate accuracies for each class, in addition to an overall accuracy which considers a set of classes; and wherein the classes are ordered based on a neural network output order specified during training of the neural network.

23. The apparatus of claim 16, wherein a decoding process is initiated by the apparatus with an identifier having a neural network representation start unit neural network representation unit type.

24. The apparatus of claim 16, wherein the at least one neural network representation syntax element comprises a neural network representation model parameter set identifier that indicates global neural network model parameters.

25. The apparatus of claim 16, wherein the decompressed configuration or representation of the neural network is generated based on an application of data dependent-based sparsification of the neural network with regard to a sparsification ratio that sets a value of at least one weight of the neural network to zero.

26. The apparatus of claim 16, wherein:

the at least one neural network representation syntax element indicates at least one neural network representation topology unit payload semantic comprising a topology storage format value signaled in a corresponding neural network representation topology unit header, the topology storage format value describes a topology of the neural network, and the at least one syntax element that is decoded to generate the decompressed configuration or representation of the neural network to generate decompressed data which complies with the neural network representation decompressed data format comprises: the at least one neural network representation syntax element that indicates at least one neural network representation topology unit payload semantic comprising the topology storage format value signaled in the corresponding neural network representation topology unit header.

* * * * *